(12) United States Patent
Yamamoto et al.

(10) Patent No.: US 7,835,160 B2
(45) Date of Patent: Nov. 16, 2010

(54) ELECTRONIC CIRCUIT CONNECTION STRUCTURE AND ITS MANUFACTURING METHOD

(75) Inventors: Kenichi Yamamoto, Osaka (JP); Daisuke Suetsugu, Osaka (JP); Daido Komyoji, Nara (JP); Takashi Imanaka, Osaka (JP); Hirotaka Hisamura, Shimane (JP)

(73) Assignee: Panasonic Corporation, Osaka (JP)

( * ) Notice: Subject to any disclaimer, the term of this patent is extended or adjusted under 35 U.S.C. 154(b) by 529 days.

(21) Appl. No.: 11/996,999

(22) PCT Filed: Sep. 27, 2006

(86) PCT No.: PCT/JP2006/319178

§ 371 (c)(1),
(2), (4) Date: Jan. 28, 2008

(87) PCT Pub. No.: WO2007/037275

PCT Pub. Date: Apr. 5, 2007

(65) Prior Publication Data
US 2010/0149777 A1    Jun. 17, 2010

(30) Foreign Application Priority Data

Sep. 28, 2005 (JP) ............................. 2005-281759
Dec. 8, 2005 (JP) ............................. 2005-354401

(51) Int. Cl.
*H05K 1/11* (2006.01)
(52) U.S. Cl. ................... 361/792; 361/794; 361/760; 361/766; 361/780; 174/261; 439/65; 439/74; 439/55; 439/77; 439/67

(58) Field of Classification Search ................ 361/790, 361/791, 748, 749, 735, 736, 738, 728, 784, 361/785, 760, 772, 774, 792–795, 799, 750, 361/751, 763, 766, 780, 782, 729; 439/71, 439/70, 77, 65–67, 69, 591, 22, 935, 75, 439/83, 55, 66, 74; 174/260, 261, 250, 254, 174/255
See application file for complete search history.

(56) References Cited

U.S. PATENT DOCUMENTS 5,628,557 A * 5/1997 Huang ................ 362/249.14

(Continued)

FOREIGN PATENT DOCUMENTS

JP    6-020746    1/1994

(Continued)

OTHER PUBLICATIONS

International Search Report issued Dec. 26, 2006 in the International (PCT) Application of which the present application is the U.S. National Stage.

*Primary Examiner*—Dameon E Levi
*Assistant Examiner*—Hoa C Nguyen
(74) *Attorney, Agent, or Firm*—Wenderoth, Lind & Ponack, L.L.P.

(57) ABSTRACT

First sheet-like substrate is arranged at a region surrounded by first terminals of male connector and first circuit substrate, and second sheet-like substrate is arranged at a region surrounded by second terminals of female connector and second circuit substrate, and male connector and female connector are fitted together so that a first passive element of first sheet-like substrate and a second passive element of second sheet-like substrate configure a filter circuit.

25 Claims, 21 Drawing Sheets

U.S. PATENT DOCUMENTS

| | | | |
|---|---|---|---|
| 5,717,556 A * | 2/1998 | Yanagida | 361/803 |
| 6,129,558 A * | 10/2000 | Kihira et al. | 439/66 |
| 6,299,469 B1 * | 10/2001 | Glovatsky et al. | 439/329 |
| 6,464,510 B1 * | 10/2002 | Len | 439/65 |
| 6,603,079 B2 * | 8/2003 | Biron | 174/254 |
| 7,479,345 B2 * | 1/2009 | Nakamura | 429/129 |
| 7,618,283 B1 * | 11/2009 | Costello | 439/511 |
| 2007/0257587 A1 * | 11/2007 | Jackson | 312/330.1 |

FOREIGN PATENT DOCUMENTS

| | | |
|---|---|---|
| JP | 6-275935 | 9/1994 |
| JP | 8-008499 | 1/1996 |
| JP | 10-233562 | 9/1998 |
| JP | 11-329609 | 11/1999 |
| JP | 2004-335764 | 11/2004 |
| JP | 2004-335946 | 11/2004 |
| JP | 2005-039064 | 2/2005 |
| JP | 2005-149778 | 6/2005 |

* cited by examiner

ELECTRONIC CIRCUIT CONNECTION STRUCTURE AND ITS MANUFACTURING METHOD

This application is a U.S. national phase application of PCT International Application PCT/JP2006/319178, filed Sep. 27, 2006.

TECHNICAL FIELD

The present invention relates to electronic circuit connection structures for connecting circuit substrates, in particular, to a laminated electronic circuit connection structure in which sheet-like filter circuits are integrated, and its manufacturing method.

BACKGROUND ART

In numerous electronic equipments, an electronic component is surface mounted on various circuit substrates such as printed board, and a filter circuit configured by passive elements such as capacitor element or inductor, and resistor is arranged at a predetermined terminal pin of the electronic component to reduce high frequency noise generated from a power supply line etc. of the electronic component.

Conventionally, a circuit configuration in which one of the electrode terminals of a chip capacitor element is connected to the terminal pin and the other electrode terminal is grounded is made on the same plane as the circuit substrate mounted with the electronic component. In such configuration, however, a region for mounting the chip capacitor element is also necessary at the periphery of the electronic component, whereby a mounting density of the circuit substrate cannot be enhanced. Thus, review is made in mounting a filter circuit for preventing noise of the electronic component on the circuit substrate at as small as possible mounting area.

For instance, FIG. 21 is a view showing an example in which a conventional noise filter is accommodated and integrated with a connector. In the prior art example, a configuration in which plug inserting chamber 272 to be inserted with a plug and, at a rear part thereof, accommodating chamber 273 are arranged at housing 271 of connector 270, where filter 280 configured by capacitor element arrays etc. is accommodated in accommodating chamber 273 and integrated is shown. In housing 271, terminal 274A, which is an extended portion of terminal pin 274 projecting to accommodating chamber 273, and one end 275A of terminal 275 to be connected to a print wiring are arranged facing each other in accommodating chamber 273, and ground electrode 276 is arranged on both sides in the short side direction.

Input side external electrode 282, output side external electrode 284, and ground electrode 286 are arranged at filter 280, and the capacitor element (not shown) of a number corresponding to terminal pin 274 is formed inside. Filter 280 is accommodated in accommodating chamber 273 with upper and lower surfaces sandwiched by terminal 274A of terminal pin 274 and one end 275A of terminal 275, and both sides sandwiched by ground electrodes 276.

An example in which the filter circuit for preventing noise is integrated with the connector to reduce the mounting area on the circuit substrate according to the above configuration is disclosed in Unexamined Japanese Patent Publication No. 6-20746 (hereinafter referred to as "patent document 1").

The configuration includes a male connector with a plurality of terminal pins and a metal shell positioned so as to surround the terminal pins and connected to ground potential, and a sheet-type noise filter which can be attached to a concave part of the shell by penetrating the terminal pins is disclosed in Unexamined Japanese Patent Publication No. 11-329609 (hereinafter referred to as "patent document 2"). The sheet-type noise filter has a noise removing circuit arranged on an elastically deformable thin insulating sheet, and has a shape in which a plurality of holes for penetrating the terminal pins is formed, and a plurality of projection strips which elastically abut an inner surface of the shell when attached to the concave part of the shell is projecting out from an outer peripheral edge.

In the connector equipped with a plurality of terminal pins, a configuration of arranging a sheet-type noise absorbing element in a region surrounded by such terminal pins and connecting the same to a circuit substrate is disclosed in Unexamined Japanese Patent Publication No. 2004-335946 (hereinafter referred to as "patent document 3"). The sheet-type noise filter has a noise removing circuit arranged on an elastically deformable thin insulating sheet, and connected to a circuit substrate with a connector to be given a noise removing function. According to such configuration, the mounting area of the circuit substrate can be reduced since the insulating sheet formed with the noise filter circuit is arranged between the connector and the circuit substrate.

However, in patent document 1, the filter including the capacitor element array has a configuration of being arranged in a vertical direction with respect to the circuit substrate surface, and thus is very difficult to have a lower height and is difficult to be used in mobile electronic equipments such as mobile phone where reduction of a thickness is especially demanded.

In patent document 2, the mounting configuration is simple as it is simply used by inserting the sheet-type noise filter to the terminal pins and inserting the female connector to the terminal pins. However, elements such as capacitor element might get damaged when being inserted to the terminal pin. In order to prevent this, a sufficiently thick sheet, which is less likely to deform even by a load applied in time of insertion, must be used. Furthermore, since the connector of such configuration is not a surface mounting type, lowering of height is difficult similar to the case of patent document 1.

Furthermore, in patent document 3, a thin noise filter with respect to the connector is configured by arranging the sheet-type noise filter immediately below the connector. However, the single body of the capacitor element is merely electrically inserted between the connector and the circuit substrate, and thus a frequency filter demanded in the circuit configuration is difficult to form.

Moreover, if elements such as capacitor element and resistor element are formed on the same plane in advance to form a circuit in order to configure the sheet-type noise filter, the manufacturing process of the sheet-like noise filter becomes complicating, and cost tends to increase due to lowering in yield rate.

DISCLOSURE OF THE INVENTION

An electronic circuit connection structure of the present invention has a laminated configuration formed by engaging a male connector having a first terminal connected to a connection terminal of a first circuit substrate and a female connector having a second terminal connected to a connection terminal of a second circuit substrate. A first sheet-like substrate formed with a plurality of first passive elements is arranged at a region surrounded by the first terminals arranged on both sides of the male connector and the first circuit substrate, an electrode terminal of the first passive element and the connection terminal of the first circuit substrate being connected, and one of the electrode terminals of the first passive element and the first terminal being electrically connected with a wiring for connecting the connection terminals. A second sheet-like substrate formed with a plurality of second passive elements is arranged at a region surrounded by the second terminal arranged on both sides of the female connector and the second circuit substrate, an electrode terminal of the second passive element and the connection terminal of the second circuit substrate being connected, and one of the electrode terminals of the second passive element and the second terminal being electrically connected with a wiring for connecting the connection terminals. A filter circuit is configured by the first passive element of the first sheet-like substrate and the second passive element of the second sheet-like substrate by engaging the male connector and the female connector.

According to such configuration, the thickness of the laminated electronic circuit connection structure is made the same as when the first passive element and the second passive element are not arranged although the first passive element and the second passive element are three-dimensionally arranged with respect to the male connector and the female connector. As a result, the mounting area in the first circuit substrate and the second circuit substrate can be reduced, and a compact and thin electronic circuit connection structure with higher function can be realized. The first passive element and the second passive element are desirably formed using a thin film forming technique.

An electronic circuit connection structure of the present invention includes a first wiring substrate including a first connection terminal region formed at a constant pitch on a first base material; a second wiring substrate including a second connection terminal region formed at a pitch same as the first connection terminal on a second base material; and a sheet-like substrate for electrically connecting the first connection terminal region of the first wiring substrate and the second connection terminal region of the second wiring substrate. The sheet-like substrate includes a sheet-like base material which surface is at least insulative; a plurality of wiring conductors formed on the sheet-like base material and connecting connection terminals of the two wiring substrates; and a capacitor element formed on the sheet-type base material and configured by a lower layer electrode layer, a dielectric layer, and an upper layer electrode layer; where a wiring conductor set in advance of the wiring conductors is electrically connected to the lower layer electrode layer or the upper layer electrode layer of the capacitor element, and the upper layer electrode layer or the lower layer electrode layer of the capacitor element is connected to a ground conductor of the wiring conductors.

According to such configuration, even if the capacitor element is formed, the first wiring substrate and the second wiring substrate are electrically connected, and at the same time, connected with the noise removal capacitor element using a thin and flexible sheet-like substrate. As a result, an electronic circuit connection structure having a higher density circuit scale compared to the conventional configuration can be realized.

A method for manufacturing an electronic circuit connection structure of the present invention includes the steps of forming a first sheet-like substrate having a shape at least smaller than a region surrounded by first terminals arranged on both sides of a male connector and being arranged with a first passive element at a position corresponding to the first terminal; forming a first circuit substrate including a connection terminal at a position corresponding to the first terminal of the male connector and an electrode terminal of the first passive element of the first sheet-like substrate; forming a second sheet-like substrate having a shape at least smaller than a region surrounded by second terminals arranged on both sides of a female connector and being arranged with a second passive element at a position corresponding to the second terminal; forming a second circuit substrate including a connection terminal at position corresponding to the second terminal of the female connector and an electrode terminal of the second passive element of the second sheet-like substrate; aligning and connecting the connection terminal of the first circuit substrate, and the electrode terminal of the first passive element and the first terminal of the male connector; aligning and connecting the connection terminal of the second circuit substrate, and the electrode terminal of the second passive element and the second terminal of the female connector; and configuring a filter circuit with the first passive element and the second passive element by engaging the male connector and the female connector.

According to such method, an electronic circuit connection structure configured by laminating the first sheet-like substrate and the second sheet-like substrate is manufactured through simple manufacturing steps.

Figure 1A:
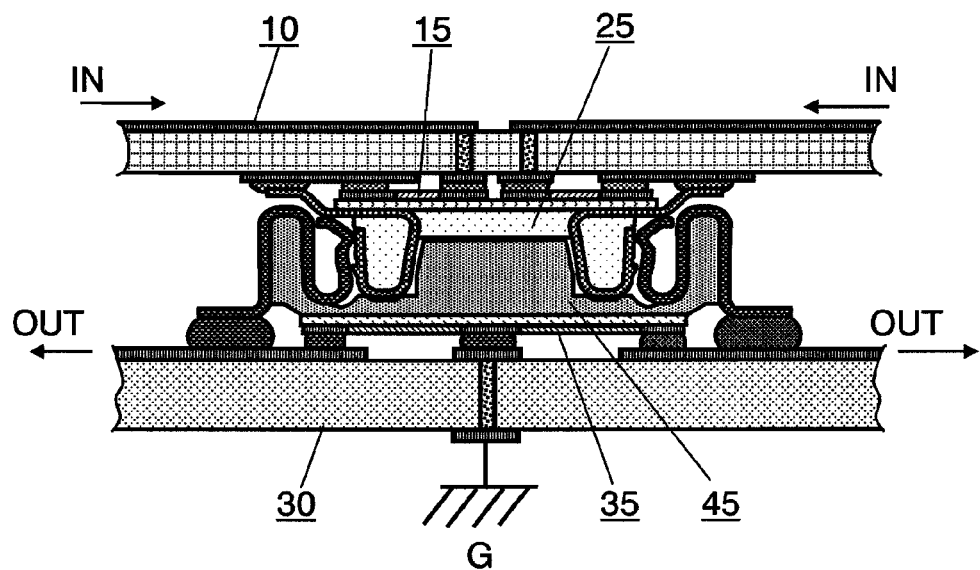
FIG. 1A is a cross sectional view of an electronic circuit connection structure according to a first exemplary embodiment of the present invention.

REFERENCE MARKS IN THE DRAWINGS 10 first circuit substrate
11, 16, 31, 36, 51 base material
12, 12A, 12B input wiring
13A, 13B, 13C, 13D, 13E, 13F, 32A, 32B, 32C, 32D, 32E connection terminal
13G, 13H, 32F, 32G wiring
14, 34, 60, 61, 159 penetrating conductor
15, 50 first sheet-like substrate
17, 19, 20, 22, 37, 39, 41, 52, 54, 55, 57, 58, 59 electrode terminal
18, 21, 53, 56 resistor element (first passive element)
25 male connector
26, 46 housing
27, 27A, 27B, 27C, 27D first terminal
28, 48 soldering
30 second circuit substrate
33 ground terminal
35 second sheet-like substrate
38, 40 capacitor element (second passive element)
45 female connector
47, 47A, 47B, 47C, 47D second terminal
49A first concave part
49B second concave part
62 inductor element (first passive element)
101, 125, 126, 135, 145, 155, 160, 180 sheet-like substrate
102, 136, 146, 156, 181 sheet-like base material
103, 137, 162A, 165, 182 wiring conductor
103A, 103B, 105B, 137A, 137B, 139B, 147B, 182A, 186A connection region
103C, 137C, 147, 158, 162 lower layer electrode layer
104, 138, 148, 163, 185 dielectric layer
105, 139, 149, 157, 164, 186 upper layer electrode layer
105A, 139A, 147A, 158A ground conductor
106, 140, 150, 161, 183, 184 capacitor element
107, 144, 166, 187 protective film
110, 167 first wiring substrate
111, 168 first base material
112, 169 first connection terminal region
114, 170 second wiring substrate
115, 171 second base material
116, 172 second connection terminal region
116A inter-substrate connection terminal region
116B ground connection terminal region
118, 173, 190 fixing lower base
119, 174, 191 elastic member
120, 175, 192 fixing upper base
142 resistor layer
143 resistor
164A ground conductor (wiring conductor)
169A, 172A element connection terminal region
169B, 172B ground connection terminal
169C, 172C connection terminal region
182B, 182C part (lower layer electrode layer)

PREFERRED EMBODIMENTS FOR CARRYING OUT OF THE INVENTION

A laminated electronic circuit connection structure of the present invention will now be described with reference to the drawings. Same reference marks are denoted for the same elements, and the description will be omitted in some cases.

First Exemplary Embodiment

Figure 1B:
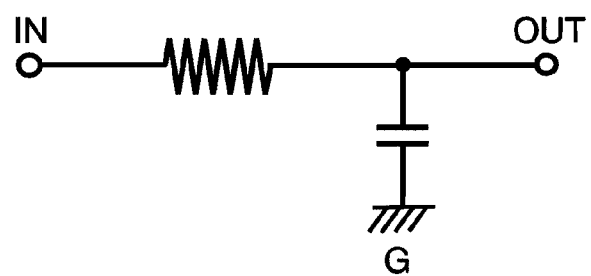
FIG. 1B is a view showing a circuit configuration of a filter circuit of a connector connection portion of the electronic circuit connection structure according to the first embodiment of the present invention.
Figure 2A:
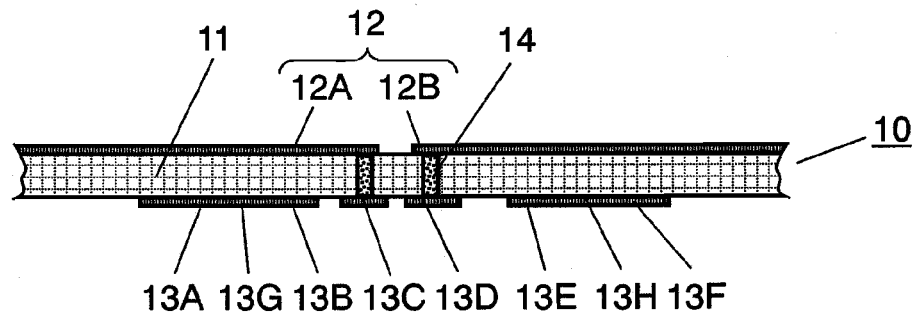
FIG. 2A is a cross sectional view of a first circuit substrate in the electronic circuit connection structure according to the first exemplary embodiment of the present invention.
Figure 2B:
FIG. 2B is a cross sectional view of a first sheet-like substrate in the electronic circuit connection structure according to the first exemplary embodiment of the present invention.
Figure 2C:
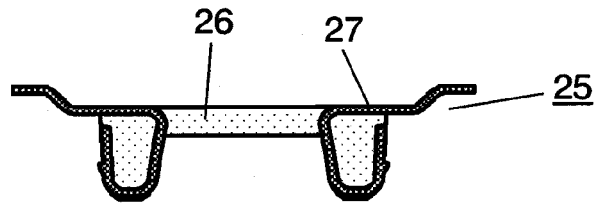
FIG. 2C is a cross sectional view of a male connector in the electronic circuit connection structure according to the first exemplary embodiment of the present invention.
Figure 2D:
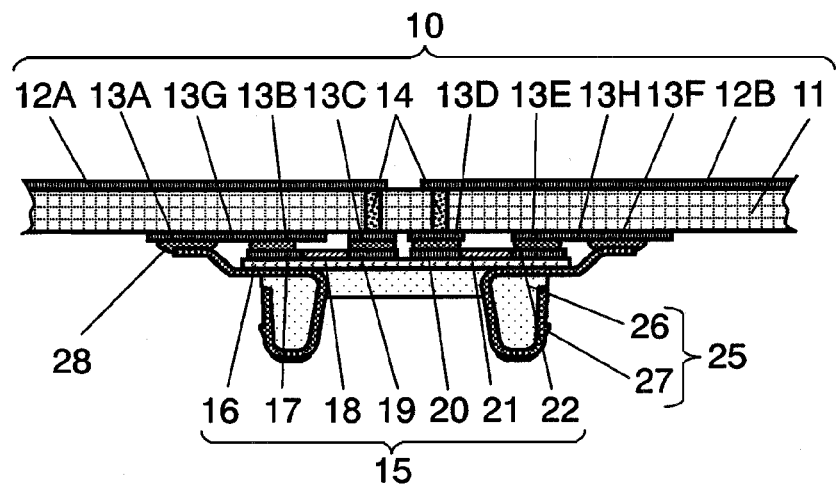
FIG. 2D is a cross sectional view of the electronic circuit connection structure of the first exemplary embodiment of the present invention in which components of FIG. 2A to FIG. 2C are connected.
Figure 3:
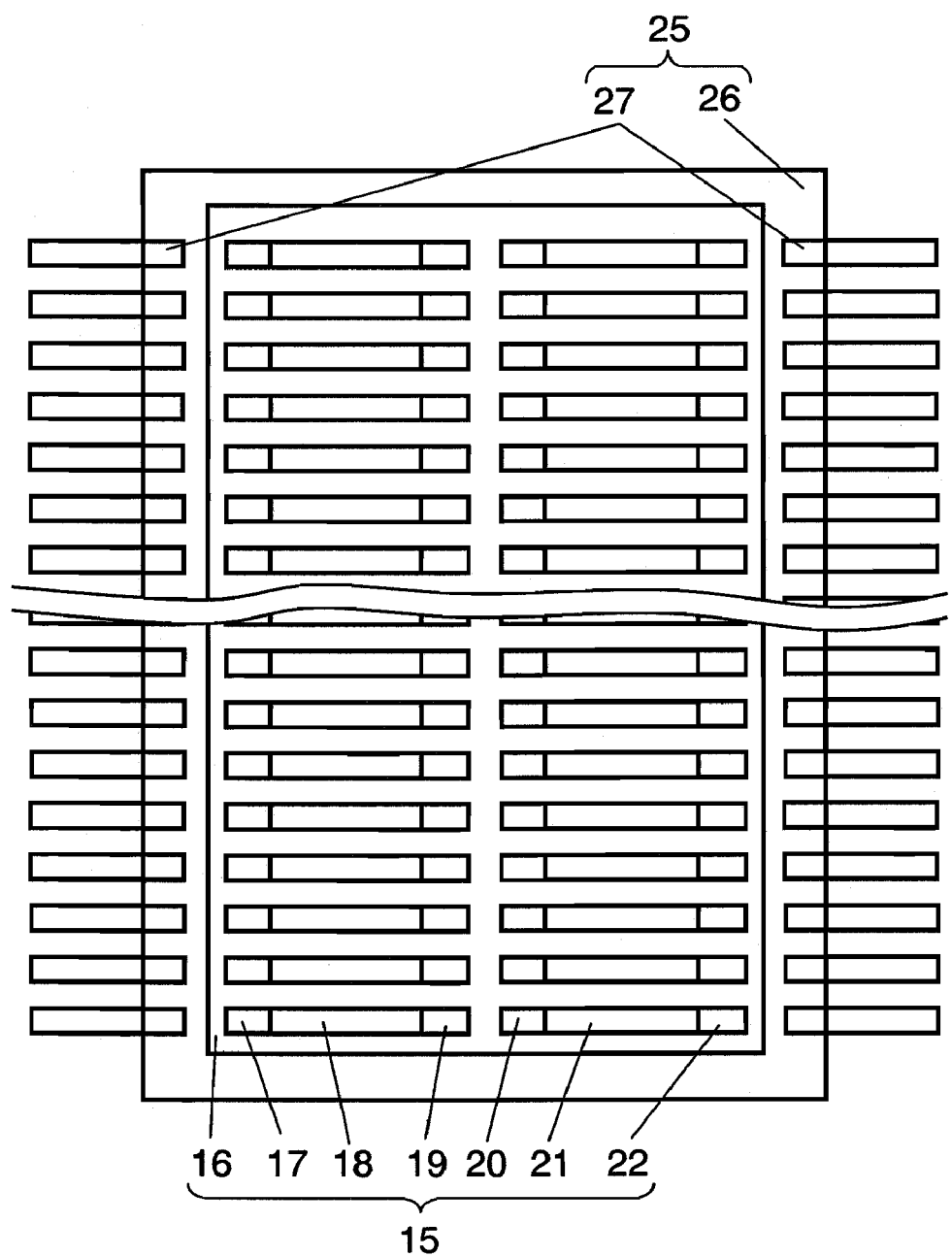
FIG. 3 is a plan view showing a state in which the first sheet-like substrate is fixed on a surface facing the first circuit substrate of the male connector in the electronic circuit connection structure according to the first exemplary embodiment of the present invention.
Figure 4A:
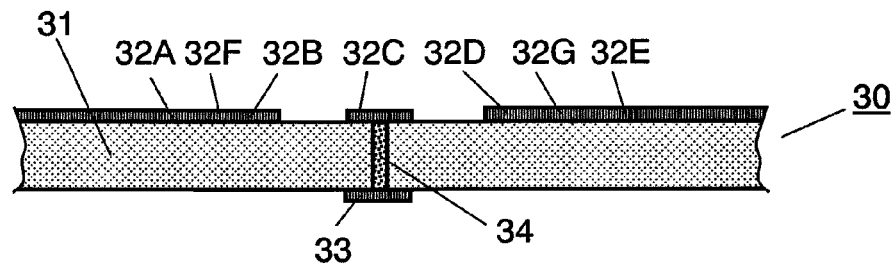
FIG. 4A is a cross sectional view of a second circuit substrate in the electronic circuit connection structure according to the first exemplary embodiment of the present invention.
Figure 4B:
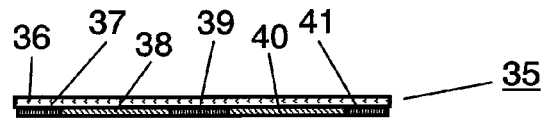
FIG. 4B is a cross sectional view of a second sheet-like substrate in the electronic circuit connection structure according to the first exemplary embodiment of the present invention.
Figure 4C:
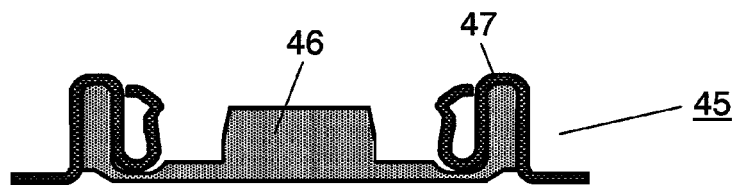
FIG. 4C is a cross sectional view of a female connector in the electronic circuit connection structure according to the first exemplary embodiment of the present invention.
Figure 4D:
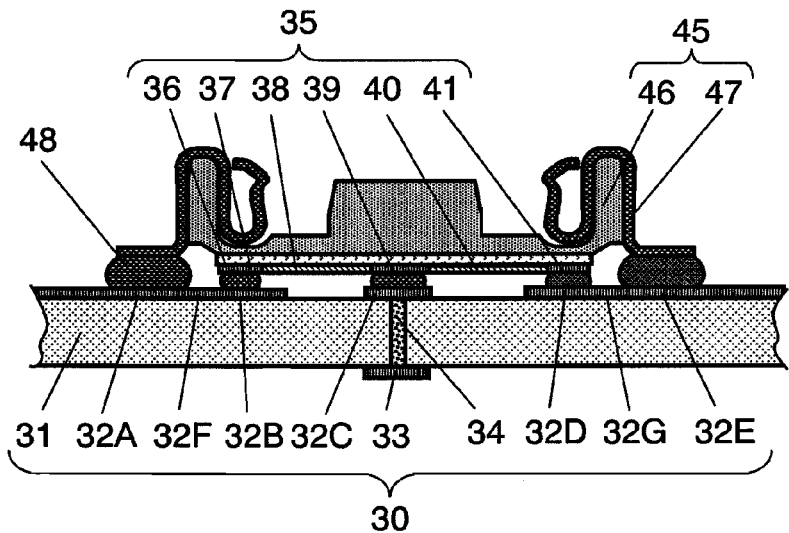
FIG. 4D is a cross sectional view of the electronic circuit connection structure of the first exemplary embodiment of the present invention in which components of FIG. 4A to FIG. 4C are connected.
Figure 5:
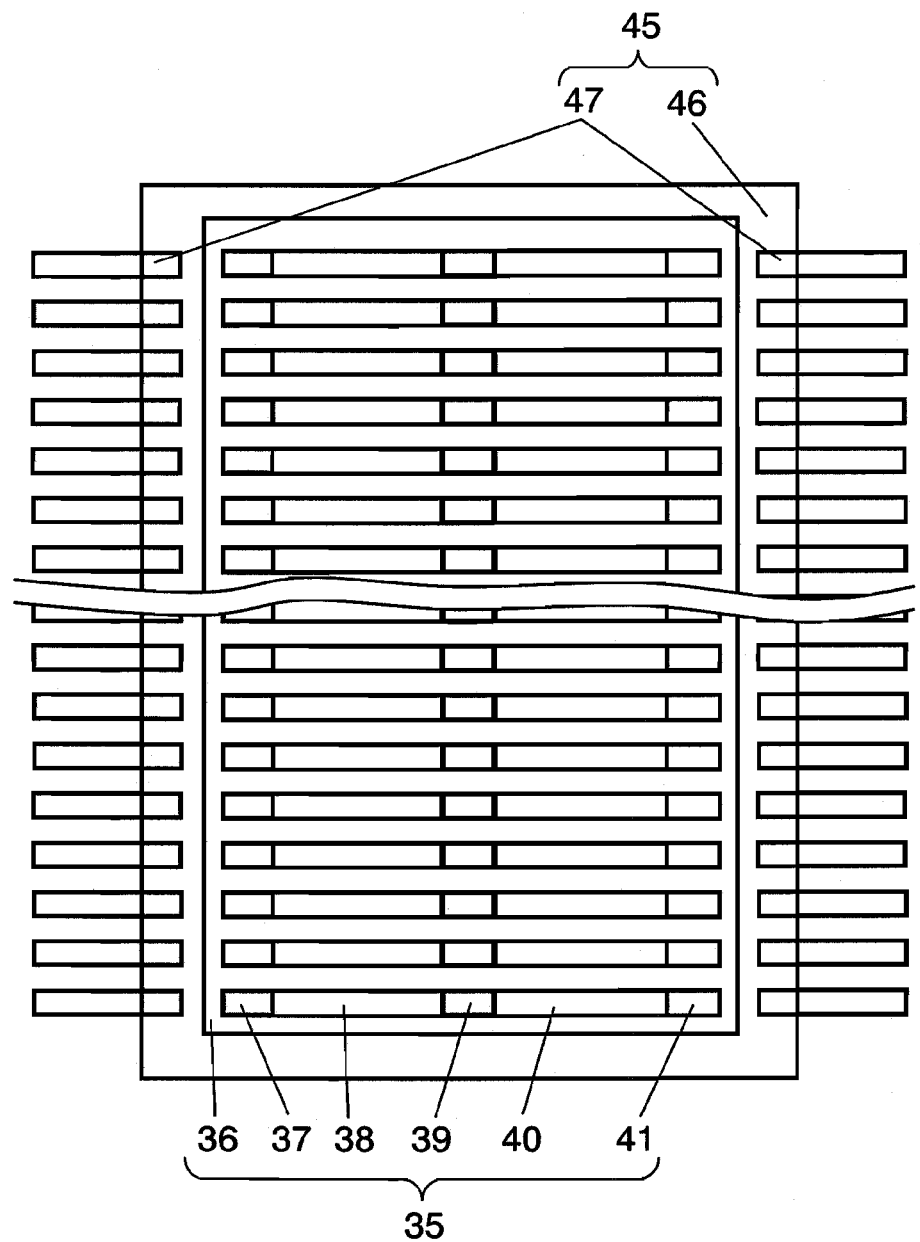
FIG. 5 is a plan view showing a state in which the second sheet-like substrate is fixed on a surface facing the second circuit substrate of the female connector in the electronic circuit connection structure according to the first exemplary embodiment of the present invention.

FIG. 1A is a cross sectional view of a laminated electronic circuit connection structure according to a first exemplary embodiment of the present invention; and FIG. 1B is a view showing a circuit configuration of a filter circuit of a connector connection portion. FIG. 2A to FIG. 2C are views showing respective configuration of first circuit substrate 10, first sheet-like substrate 15, and male connector 25, and FIG. 2D is a cross sectional view showing a configuration in which they are connected. FIG. 3 is a plan view showing a state in which first sheet-like substrate 15 is fixed on a surface facing first circuit substrate 10 of male connector 25. FIG. 4A to FIG. 4C are views showing respective configuration of second circuit substrate 30, second sheet-like substrate 35, and female connector 45, and FIG. 4D is a cross sectional view showing a configuration in which they are connected. FIG. 5 is a plan view showing a state in which second sheet-like substrate 15 is fixed on a surface facing second circuit substrate 30 of female connector 45.

The electronic circuit connection structure of the present exemplary embodiment will be described with reference to FIG. 1A to FIG. 5. In the present exemplary embodiment, description is made with a first passive element including a resistor element, a second passive element including a capacitor element, and a filter circuit as a CR filter by way of example. The first passive element is sometimes referred to as the resistor element, and the second passive element as the capacitor element below.

As shown in FIG. 1A, the electronic circuit connection structure of the present exemplary embodiment has a laminated configuration formed by engaging male connector 25 having a first terminal connected to a connection terminal of first circuit substrate 10 and female connector 45 having a second terminal connected to a connection terminal of second circuit substrate 30. First sheet-like substrate 15 formed with a plurality of first passive elements is arranged at a region surrounded by the first terminal arranged on both sides of male connector 25 and first circuit substrate 10, where an electrode terminal of the first passive element and the connection terminal of first circuit substrate 10 are connected, and one electrode terminal of the first passive element and the first terminal are electrically connected by a wiring for connecting the connection terminals. Furthermore, second sheet-like substrate 35 formed with a plurality of second passive elements is arranged at a region surrounded by the second terminal arranged on both sides of female connector 45 and second circuit substrate 30, where an electrode terminal of the second passive element and the connection terminal of second circuit substrate 30 are connected, and one electrode terminal of the second passive element and the second terminal are electrically connected by a wiring for connecting the connection terminals. The first passive element of first sheet-like substrate 15 and the second passive element of second sheet-like substrate 35 configure a CR filter circuit by engaging male connector 25 and female connector 45.

A configuration in which first circuit substrate 10, first sheet-like substrate 15, and male connector 25 are integrated will be described first with reference to FIG. 2A to FIG. 2D and FIG. 3.

As shown in FIG. 2A, first circuit substrate 10 is formed by at least a double-sided wiring substrate. Input wiring 12 is formed on one face of base material 11. Input wiring 12 is extended from both sides of base material 11 towards a central part, and is connected to connection terminals 13C and 13D formed on the other face by way of penetrating conductor 14. Input wiring 12, penetrating conductors 14, and connection terminals 13C and 13D are formed by the same number as first terminals 27 of male connector 25 in correspondence to a pitch of first terminal 27. Connection terminals 13A and 13F to be connected to first terminal 27 and connection terminals 13B and 13E to be connected to electrode terminals 17 and 22 of first sheet-like substrate 15 are formed on the other face of base material 11. Connection terminals 13A, 13B, 13E and 13F are also formed by the same number as first terminals 27 of male connector 25.

In the case of the present exemplary embodiment, connection terminal 13A and connection terminal 13B are electrically connected by wiring 13G. Similarly, connection terminal 13E and connection terminal 13F are electrically connected by wiring 13H. First circuit substrate 10 is thereby formed, where various electronic components such as semiconductor element and passive component are mounted on an extended region (not shown). The electronic components may be incorporated in base material 11 or a multi-layered wiring configuration may be adopted. First circuit substrate 10 having such configuration can be easily manufactured through the conventional process, and thus the description on the manufacturing steps will be omitted.

As shown in FIG. 2B, first sheet-like substrate 15 is arranged in array form by the number of resistor elements 18 and 21, which are the first passive elements in the present exemplary embodiment, corresponding to first terminals 27. That is, resistor element 18 has electrode terminals 17 and 19 arranged on both ends, and similarly, resistor element 21 has electrode terminals 20, 22 arranged on both ends. First sheet-like substrate 15 having such configuration is manufactured by having a resin sheet such as polyimide resin as base material 16, forming aluminum (Al) or copper (Cu) on the surface thereof through deposition or plating, forming known resistor film of nichrome, tantalum nitride or cermet material through deposition or sputtering, and performing pattern formation as shown in FIG. 3.

In order to protect resistor elements 18 and 21 from outside environment, an insulating protective layer (not shown) may be formed excluding electrode terminals 17, 19, 20 and 22. First sheet-like substrate 15 excelling in environment resistance is achieved by forming the insulating protective layer. The insulating protective layer is suitably made of ultraviolet curable resin as it is easy to form through printing process and excels in humidity resistance, but is not particularly limited to such material, and an insulating film composed of inorganic material may be formed through sputtering and the like. Furthermore, electrode terminals 17, 19, 20 and 22 desirably have a copper (Cu) film formed to between 5 µm and 20 µm and a gold (Au) film formed to about 0.2 µm thereon to achieve a satisfactory soldering property with connection terminals 13B, 13C, 13D and 13E arranged on first circuit substrate 10.

As shown in FIG. 2C, male connector 25 is configured with first terminal 27 integrally molded to housing 26, first terminal 27 being arranged with a connection portion which connects with connection terminals 13A and 13F of first circuit substrate 10 projecting to both sides. Commercially available male connector 25 can be generally used, and thus description thereof will be omitted.

As shown in FIG. 3, first sheet-like substrate 15 is fixed on a surface of housing 26 surrounded by first terminals 27 of male connector 25. First terminals 27 and resistor elements 18 and 21, which are first passive elements, of first sheet-like substrate 15 are arranged in same numbers at corresponding positions. Adhesive agent is easy to use and desirably used for the fixing method.

After fixing first sheet-like substrate 15 on male connector 25 as shown in FIG. 3 using first circuit substrate 10, first sheet-like substrate 15, and male connector 25 having the above configuration, each connection terminal 13A, 13B, 13C, 13D, 13E and 13F of first circuit substrate 10, and electrode terminals 17, 19, 20 and 22 of first sheet-type substrate 15 and first terminals 27 of male connector 25 are connected through soldering 28 as shown in FIG. 2D to form an integrated configuration. Conductive adhesive agent and the like may be used for connection.

Next, a configuration in which second circuit substrate 30, second sheet-like substrate 35 and female connector 45 are integrated will be described.

As shown in FIG. 4A, second circuit substrate 30 is formed by at least a double-sided wiring substrate. Connection terminals 32A, 32B, 32C, 32D and 32E for connecting electrode terminals 37, 39 and 41 of second sheet-like substrate 35 and second terminals 47 of female connector 45, wiring 32F for connecting connection terminal 32A and connection terminal 32B, wiring 32G for connecting connection terminal 32D and connection terminal 32E, and wiring extending from connection terminals 32A and 32E are formed on one surface of base material 31. Furthermore, connection terminal 32C is connected to ground terminal 33 formed on the other face by way of penetrating conductor 34. Connection terminals 32A, 32B, 32C, 32D and 32E are formed by the same number as second terminals 47 of female connector 45 in correspondence to a pitch of second terminal 47. Connection terminal 32C is connected with ground terminal 33 by way of penetrating conductor 34, and thus may be set as a common connection terminal. Connection terminal 32C is not only connected to ground terminal 33 of back surface by way of penetrating conductor 34, and may also be connected to ground terminal of female connector 45 on the front surface side.

Second circuit substrate 30 is formed in such manner, where various electronic components such as semiconductor element and passive components are mounted on an extended region (not shown). The electronic components may be incorporated in base material 31 or a multi-layered wiring configuration may be adopted. Second circuit substrate 30 having such configuration can be easily manufactured through the conventional process, and thus the description on the manufacturing steps will be omitted.

As shown in FIG. 4B, second sheet-like substrate 35 is arranged in array form by the number of capacitor elements 38 and 40, which are the second passive elements in the present exemplary embodiment, corresponding to second terminals 47. That is, capacitor element 38 has electrode terminals 37 and 39 arranged on both ends, and similarly, capacitor element 40 has electrode terminals 39 and 41 arranged on both ends. Electrode terminal 39 at the central part is connected each other to capacitor elements 38 and 40 at both sides.

One example of method of manufacturing second sheet-like substrate 35 will be described. Similar to first sheet-like substrate 15, second sheet-like substrate 35 is manufactured using resin sheet such as polyimide resin as base material 36, forming capacitor elements 38 and 40 in array form on base material 36 through thin film process, and furthermore, forming electrode terminals 37, 39 and 41 for connecting with connection terminals 32B, 32C and 32D of second circuit substrate 30 through thin film process and plating process.

Capacitor elements 38 and 40 are manufactured in the following manner. A lower layer electrode film (not shown) is formed at a predetermined position on base material 36 through mask deposition. Thereafter, a dielectric film (not shown) is formed on the front surface thereof leaving one part of the lower layer electrode film through sputtering using a mask. An upper layer electrode film (not shown) is further formed on the dielectric film. Electrode terminals 37, 39 and 41 are then formed to obtain second sheet-like substrate 35.

In order to protect capacitor elements 38 and 40 from outside environment, an insulating protective layer (not shown) may be formed excluding electrode terminals 37, 39 and 41, so that second sheet-like substrate 35 excelling in environment resistance is achieved.

One example of a specific manufacturing method will be described. The lower layer electrode film is not particularly limited as long as it is made of material having satisfactory adhesiveness at low resistance and having low reactivity with the dielectric film, and aluminum (Al) film is one suitable material as it is easy to form; and vacuum deposition, sputtering or plating method may be combined for the film forming method. Material having large relative permittivity and small temperature coefficient is preferable for the dielectric film, and materials generally used as dielectric material such as silicon dioxide ($SiO_2$), barium titanate ($BaTiO_3$), strontium titanate ($SrTiO_3$), or titanium oxide ($TiO_2$) may be used. The film forming method using such materials include sputtering, vacuum deposition, sol-gel method, plasma chemical vapor deposition method (PCVD method) and the like. Furthermore, material similar to that of the low layer electrode film may be appropriately used for the upper layer electrode film.

The insulating protective layer is suitably made of ultraviolet curable resin as it is easy to form through printing method and excels in humidity resistance, but is not particularly limited to such material, and an insulating film composed of inorganic material may be formed through sputtering and the like. Furthermore, electrode terminals 37, 39 and 41 desirably have a copper (Cu) film formed to between 5 μm and 20 μm and a gold (Au) film formed to about 0.2 μm thereon to achieve a satisfactory soldering property with connection terminals 32B, 32C and 32D arranged on second circuit substrate 30.

As shown in FIG. 4C, female connector 45 is configured with second terminal 47 integrally molded to housing 46, second terminal 47 being arranged with a connection portion which connects with connection terminals 32A and 32E of second circuit substrate 30 projecting to both sides. Commercially available female connector 45 can be generally used, and thus description thereof will be omitted.

As shown in FIG. 5, second sheet-like substrate 35 is fixed on a face of housing 46 surrounded by second terminals 47 of female connector 45. Second terminals 47 and capacitor elements 38 and 40, which are second passive elements, of second sheet-like substrate 35 are arranged in same numbers at corresponding positions. Adhesive agent is easy to use and desirably used for the fixing method.

After fixing second sheet-like substrate 35 on female connector 45 as shown in FIG. 5 using second circuit substrate 30, second sheet-like substrate 35 and female connector 45 having the above configuration, each connection terminal 32A, 32B, 32C, 32D and 32E of second circuit substrate 30, and electrode terminals 37, 39 and 41 of second sheet-like substrate 35 and second terminals 47 of female connector 45 are connected through soldering 48 as shown in FIG. 4D to form an integrated configuration. Conductive adhesive agent and the like may be used for connection.

After forming the integrated configuration as shown in FIG. 2D and FIG. 4D, male connector 25 and female connector 45 are fitted together to obtain the electronic circuit connection structure shown in FIG. 1A.

The electrical connection of first circuit substrate 10 and second circuit substrate 30 by male connector 25 and female connector 45 is as follows. Input wiring 12 of first circuit substrate 10 is connected to connection terminals 13C and 13D formed on the other face by way of penetrating conductors 14. Connection terminals 13C and 13D and electrode terminals 19 and 20 of first sheet-like substrate 15 are connected through soldering. Furthermore, electrode terminals 17, 22 and connection terminals 13B and 13E are respectively connected through soldering. Connection terminal 13A and connection terminal 13B are connected by wiring 13G, and connection terminal 13E and the connection terminal 13F are connected by wiring 13H. Therefore, an input signal (IN) transmits to first terminal 27 of male connector 25 via resistor elements 18 and 21.

Second terminals 47 of female connector 45 are connected to connection terminals 32A and 32E of second circuit substrate 30. Therefore, the input signal (IN) is output to each wiring or extended portion of connection terminals 32A and 32E via resistor elements 18 and 21, first terminals 27, second terminals 47 and connection terminals 32A and 32E.

Connection terminal 32A and connection terminal 32B of second circuit substrate 30, as well as connection terminal 32D and connection terminal 32E are connected by wirings 32F and 32G, respectively. Connection terminals 32B and 32D are connected to one of electrode terminals 37 and 41 of capacitor elements 38 and 40 of second sheet-like substrate 35. Another electrode terminal 39 of capacitor elements 38 and 40 is connected to connection terminal 32C of second circuit substrate 30, and connected to ground terminal 33 by way of penetrating conductor 34.

As apparent from the above configuration, in the present exemplary embodiment, resistor elements 18 and 21 are inserted in series with respect to the input signal (IN) and an output signal (OUT) as shown in FIG. 1B, and capacitor elements 38 and 40 are connected in parallel thereto with one electrode terminal grounded, thereby configuring the CR filter circuit.

The electronic circuit connection structure of the present exemplary embodiment has resistor elements 18 and 21 and capacitor elements 38 and 40 configuring the CR filter formed through the thin film process, and it has both first sheet-like substrate 15 and second sheet-like substrate 35 formed very thin. Since first sheet-like substrate 15 and second sheet-like substrate 35 are respectively arranged at a gap between male connector 25 and first circuit substrate 10 and in a gap between female connector 45 and second circuit substrate 30, the mounting region of first circuit substrate 10 and second circuit substrate 30 will not increase even if the CR filter circuit is added. Consequently, a compact and thin electronic circuit connection structure having higher function can be realized.

Figure 6A:
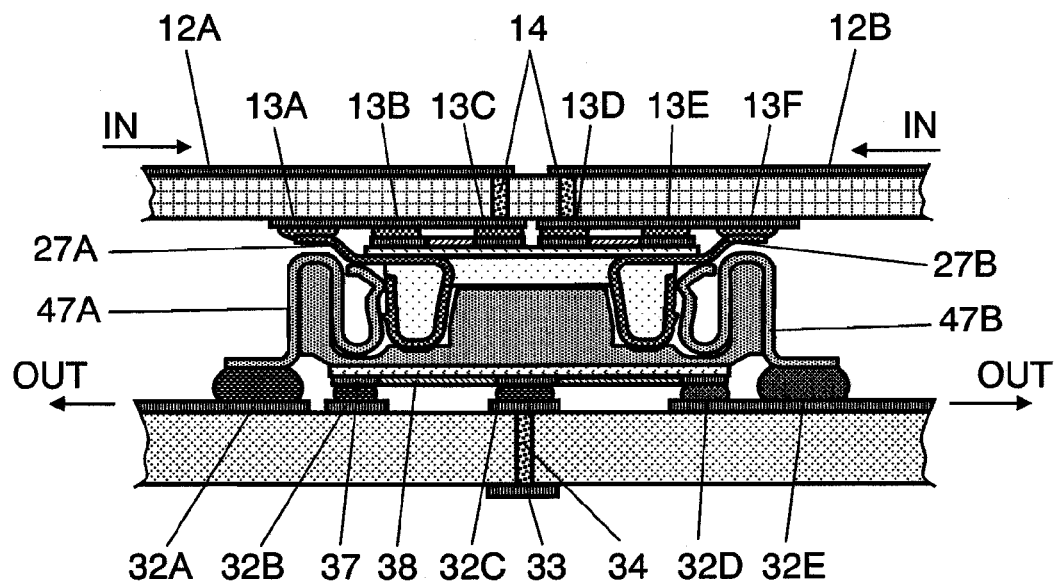
FIG. 6A is a view showing a configuration of a case where only the capacitor element is connected to the terminal for noise removal and a case where the resistor element and the capacitor element are not connected in the electronic circuit connection structure of the first exemplary embodiment of the present invention.
Figure 6B:
FIG. 6B is a view showing a configuration of a case where the resistor element and the capacitor element are not connected in FIG. 6A.
Figure 6C:
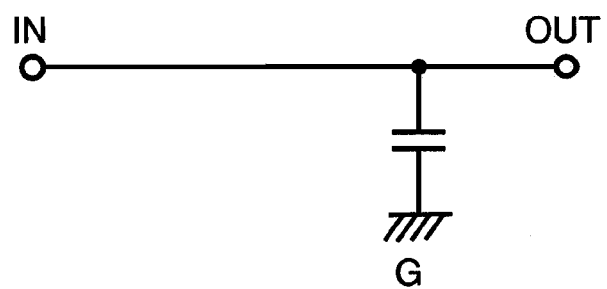
FIG. 6C is a view showing a configuration of a case where only the capacitor element is connected to the terminal for noise removal in FIG. 6A.

Generally, the CR filter circuit often does not need to be connected to all the terminals of the connector. The configuration in such case is shown in FIG. 6A to FIG. 6C. FIG. 6A to FIG. 6C are views showing a configuration of a case where the resistor element and the capacitor element are not connected, and a case where only the capacitor element is connected to the terminal for noise removal. First terminal 27 and second terminal 47 on the left side shown in FIG. 6A are referred to as first terminal 27A and second terminal 47A, and first terminal 27 and second terminal 47 on the right side are referred to as first terminal 27B and second terminal 47B for the sake of convenience of explanation.

As shown in FIG. 6A, connection terminals 13A, 13B and 13C of first circuit substrate 10 connected with first terminal 27A are electrically connected by wiring. The input signal (IN) input from input wiring 12A thus transmits to first terminal 27A without passing through resistor element 18.

Furthermore, a wiring is not arranged between connection terminal 32A of second circuit substrate 30 connected with second terminal 47A and connection terminal 32B connected with one electrode terminal 37 of capacitor element 38, and an opened state is obtained.

According to such wiring configuration, a circuit configuration in which resistor element 18 and capacitor element 38 are not connected at all as shown in FIG. 6B can be obtained.

Connection terminals 13D, 13E and 13F of first circuit substrate 10 connected with first terminals 27 are also electrically connected by wiring. The input signal (IN) input from input wiring 12B thus transmits to first terminal 27B without passing through resistor element 21.

Connection terminal 32E of second circuit substrate 30 connected with second terminal 47B and connection terminal 32D connected with one electrode terminal 41 of capacitor element 40 are connected by wiring.

According to such wiring configuration, a circuit configuration for preventing noise in which capacitor element 40 is connected between the input signal (IN) and the output signal (OUT), and the other electrode is grounded to ground terminal (G) as shown in FIG. 6C can be obtained.

In the electronic circuit connection structure of the present exemplary embodiment, a configuration of not connecting the CR filter circuit, the noise prevention circuit equipped with only the capacitor element, or the filter circuit may be freely set according to the terminal by simply changing the pattern of the wirings of first circuit substrate 10 and second circuit substrate while maintaining the configuration of first sheet-like substrate 15, second sheet-type substrate 35, male connector 25 and female connector 45 constant. Therefore, degree of freedom of design of the electronic circuit connection structure can be expanded.

Furthermore, first passive elements 18 and 21 of first sheet-like substrate 15 may be capacitor elements, and second passive elements 38 and 40 of second sheet-like substrate 35 may be resistor elements. According to such configuration, a high-pass filter circuit in which a capacitor element is connected between the input signal (IN) and the output signal (OUT) and one electrode terminal of the resistor element is connected to the ground terminal can be obtained.

Figure 7:
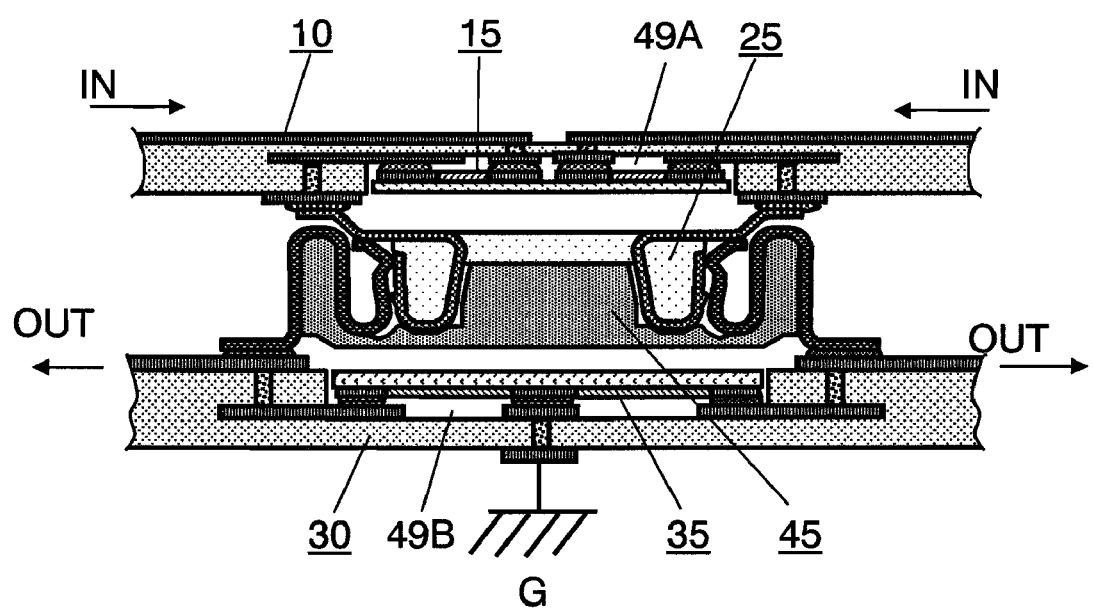
FIG. 7 is a cross sectional view of another example of the electronic circuit connection structure according to the first exemplary embodiment of the present invention.

In the present exemplary embodiment, an example of forming the first sheet-like substrate and the second sheet-like substrate on the front surface of the first circuit substrate and the second circuit substrate has been described, but is not limited thereto. For instance, obviously, at least either first concave part 49A for accommodating first sheet-like substrate 15 may be arranged at first circuit substrate 10, or second concave part 49B for accommodating second sheet-like substrate 35 may be arranged at second circuit substrate 30, as shown in FIG. 7. Accordingly, the thickness of the electronic component connection structure can be further reduced.

In this case, the electrode terminal connected with the first passive element or the second passive element arranged at first concave part 49A or second concave part 49B is connected to a predetermined electrode by way of the penetrating conductor. Thus, preferably, first circuit substrate 10 and second circuit substrate 30 use a multi-layered wiring substrate.

Second Exemplary Embodiment

Figure 8A:
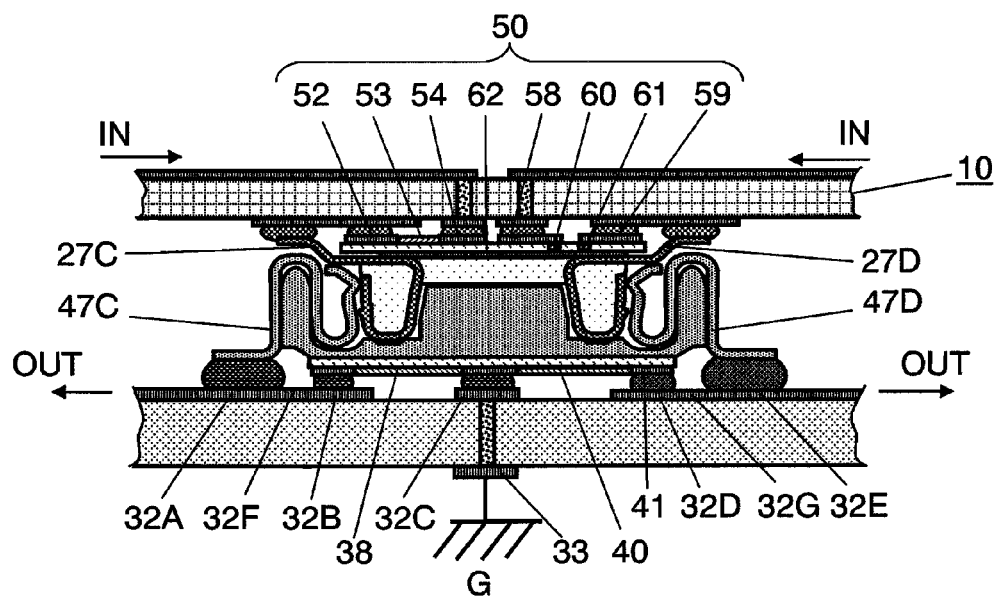
FIG. 8A is a cross sectional view taken along line 8A-8A of FIG. 9 of an electronic circuit connection structure according to a second exemplary embodiment of the present invention.
Figure 8B:
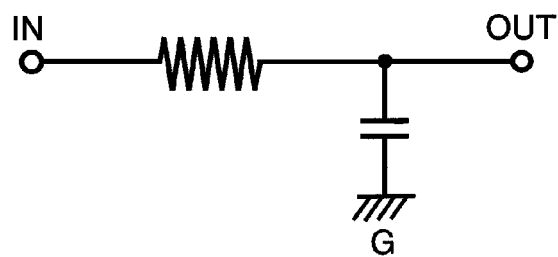
FIG. 8B is a view showing a circuit configuration of a filter circuit of a connector connection portion of FIG. 8A.
Figure 8C:
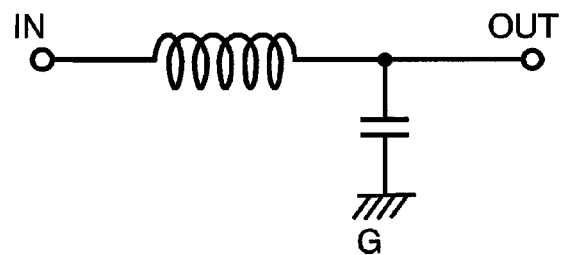
FIG. 8C is a view showing the circuit configuration of the filter circuit of the connector connection portion of FIG. 8A.
Figure 9:
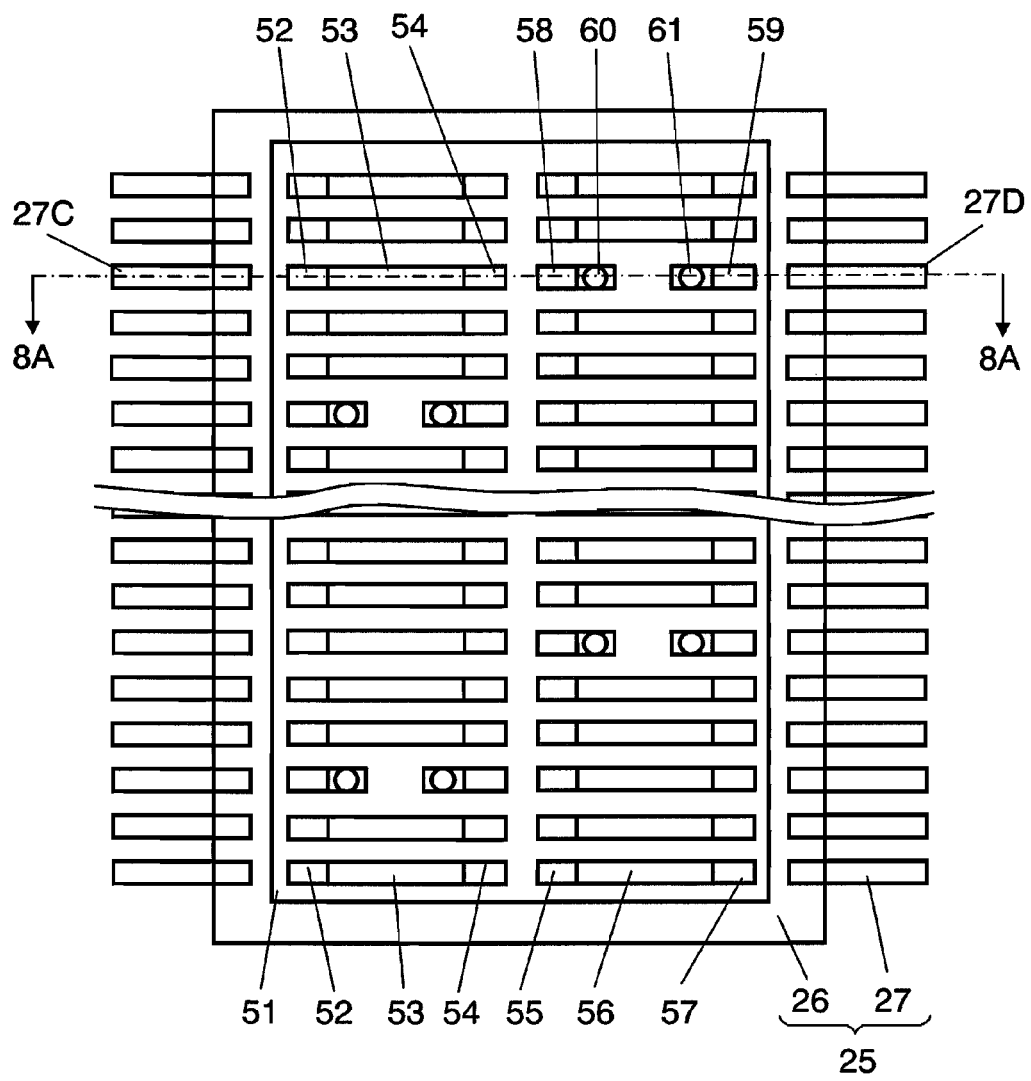
FIG. 9 is a plan view showing a state in which a first sheet-like substrate is fixed on a surface facing a first circuit substrate of a male connector in the electronic circuit connection structure according to the second exemplary embodiment of the present invention.

FIG. 8A is a cross sectional view of an electronic circuit connection structure according to a second exemplary embodiment of the present invention, and FIG. 8B and FIG. 8C are views showing a filter circuit configuration of a connector connection portion. FIG. 9 is a plan view showing a state in which first sheet-like substrate 50 used in the present exemplary embodiment is fixed on a surface facing first circuit substrate 10 of male connector 25. Furthermore, FIG. 10A is a plan view seen from the front surface side formed with a resistor element serving as the first passive element of first sheet-like substrate 50 of the present exemplary embodiment, and FIG. 10B is a plan view seen from the back surface side formed with an inductor element also serving as the first passive element.

The electronic circuit connection structure of the present exemplary embodiment will now be described with reference to FIG. 8A to FIG. 10B. In the present exemplary embodiment, an example in which the first passive element includes the resistor element and the inductor element, the second passive element includes the capacitor element, and the filter circuit is a CR filter and an LC filter will be described, but is not limited thereto. For instance, an LC filter configuration in which the first passive element includes only the inductor element and the second passive element includes the capacitor element may be obtained. The first passive element is sometimes referred to as resistor element 53 and inductor element 62, and the second element as capacitor element 38 and 40 below.

As shown in FIG. 8A, the electronic circuit connection structure of the present exemplary embodiment has a laminated configuration obtained by engaging male connector 25 having first terminals 27 connected to the connection terminals of first circuit substrate 10 and female connector 45 having second terminals 47 connected to the connection terminals of second circuit substrate 30. The laminated configuration is the same as that of the electronic circuit connection structure of the first exemplary embodiment, and thus the description thereof will be omitted.

Figure 10A:
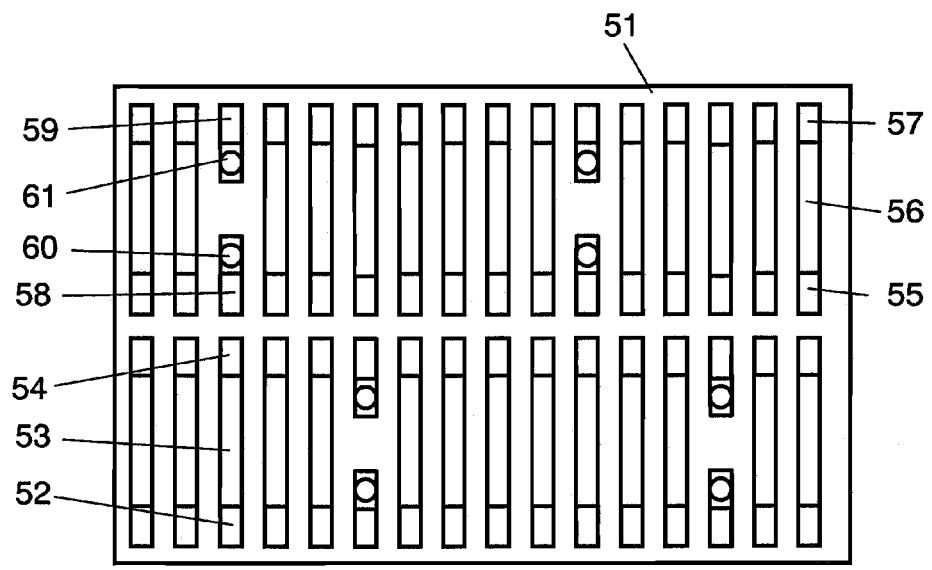
FIG. 10A is a plan view seen from the front surface side formed with a resistor element serving as the first passive element of the first sheet-like substrate in the electronic circuit connection structure according to the second exemplary embodiment of the present invention.
Figure 10B:
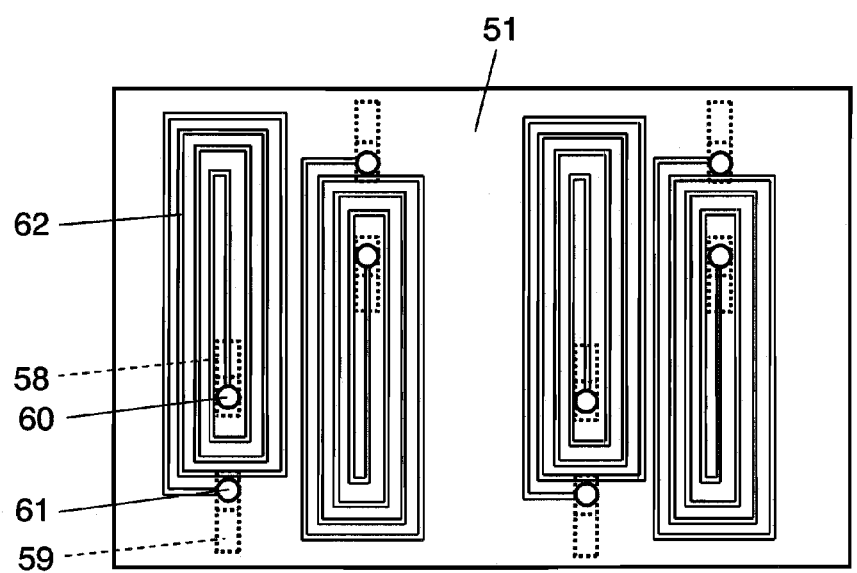
FIG. 10B is a plan view seen from the back surface side formed with an inductor element serving as the first passive element of the first sheet-like substrate in the electronic circuit connection structure according to the second exemplary embodiment of the present invention.

In the present exemplary embodiment, first circuit substrate 10, male connector 25, second circuit substrate 30, second sheet-like substrate 35, and female connector 45 are the same as those of the electronic circuit connection structure of the first exemplary embodiment, and features lies in that the configuration of first sheet-like substrate 50 is different as shown in FIG. 10A and FIG. 10B. That is, in the present exemplary embodiment, first sheet-like substrate 50 is formed with resistor elements 53 and 56 on the front surface side, similar to first sheet-like substrate 15 of the first exemplary embodiment, but the resistor element is not formed at one part of the region and a region for forming penetrating conductors 60 and 61 and electrode terminals 58 and 59 for connecting with inductor element 62 arranged on the back surface is provided. As shown in FIG. 10B, inductor element 62 formed with a conductor pattern is arranged on the back surface. Inductor element 62 is connected to electrode terminals 58 and 59 formed on the front surface side by way of penetrating conductors 60 and 61. Electrode terminals 58 and 59 are arranged at the same position and at the same pitch as electrode terminals 52, 54, 55 and 57 of resistor elements 53 and 56. Similar to the first exemplary embodiment, polyimide resin sheet is used for base material 51. In the pattern of the back surface shown in FIG. 10B, only the electrode terminals on the front surface side to be connected to inductor element 62 are shown with a dotted line, and resistor elements and electrode terminals thereof are omitted.

First sheet-like substrate 50 having the above configuration is connected as shown in FIG. 8A. The pitch of electrode terminals 52, 54, 55, 57, 58 and 59 of first sheet-like substrate 50 is the same as the pitch of first terminals 27 of male connector 25, and can be connected through a mounting method same as in the electronic circuit connection structure of the first exemplary embodiment. The cross section shown in FIG. 8A is the cross section taken along line 8A-8A of FIG. 9. The filter circuit configuration will be described below, where the terminals on the left side of FIG. 8A are referred to as first terminal 27C and second terminal 47C and on the right side as first terminal 27D and second terminal 47D for the sake of convenience of explanation.

Regarding first terminal 27C and second terminal 47C on the left side, the input signal (IN) transmits to first terminal 27C via resistor element 53, and outputs as the output signal (OUT) via first terminal 27C and second terminal 47C. Connection terminal 32A of second circuit substrate 30 connected with second terminal 47C and connection terminal 32B connected with electrode terminal 37 of second sheet-like substrate 35 are electrically connected by wiring 32F. Therefore, connection to ground terminal 33 is established through capacitor element 38. Accordingly, the CR filter circuit is connected to such terminals, as shown in FIG. 8B.

On the other hand, regarding first terminal 27D and second terminal 47D on the right side, the input signal (IN) transmits to first terminal 27D via inductor element 62, and outputs as the output signal (OUT) via first terminal 27D and second terminal 47D. Connection terminal 32E of second circuit substrate 30 connected with second terminal 47D and connection terminal 32D connected with electrode terminal 41 of second sheet-like substrate 35 are electrically connected by wiring 32G. Therefore, connection to ground terminal 33 is made through capacitor element 40. Accordingly, the LC filter circuit is connected to such terminals, as shown in FIG. 8C.

In the electronic circuit connection structure of the present exemplary embodiment, resistor elements 53 and 56 are arranged on the front surface side of first sheet-like substrate 50, inductor element 62 is arranged on the back surface side, and electrode terminals 52, 54, 55, 57, 58 and 59 for connecting with first circuit substrate 10 are arranged at positions corresponding to first terminals 27 of male connector 25. Accordingly, the CR filter circuit or the LC filter circuit can be connected to the terminals set in advance.

Furthermore, in the present exemplary embodiment as well, a configuration of not connecting the filter circuit or a configuration of connecting only the capacitor element may be obtained by having predetermined connection terminals of the first circuit substrate and the second circuit substrate in a short-circuit state and in an opened state by wiring, similar to the first exemplary embodiment. Thus, the required filter circuit can be respectively connected to the terminals of the connector. That is, in the electronic circuit connection structure of the present exemplary embodiment, a configuration of connecting the CR filter, the LC filter, the noise prevention circuit equipped with only C, or a configuration of not connecting the filter circuit can be obtained.

In the first exemplary embodiment and the second exemplary embodiment, the resistor element and the capacitor element are formed by the number of the terminals of the connector, but the present invention is not limited thereto. When the terminals for connecting the filter circuit are set in advance, the first sheet-like substrate and the second sheet-like substrate formed with the resistor element and the capacitor element only at positions corresponding to the terminals may be used.

The resistor element, the capacitor element, and the inductor element do not all need to have the same resistance value or capacitance, and may have different values. Different values can be easily achieved by changing the pattern shape or the number of windings.

In the present exemplary embodiment, the first sheet-like substrate and the second sheet-like substrate are adhered to the male connector and the female connector in advance before being mounted on the first circuit substrate and the second circuit substrate, but the present invention is not limited thereto. The male connector and the female connector may be respectively mounted after mounting the first sheet-like substrate and the second sheet-like substrate on the first circuit substrate and the second circuit substrate.

Third Exemplary Embodiment

Figure 11A:
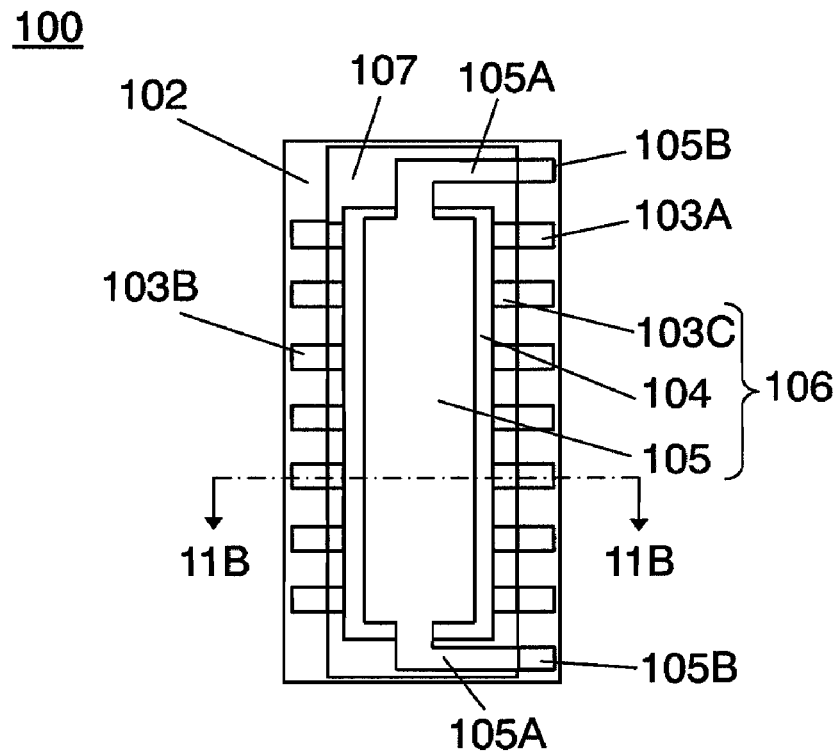
FIG. 11A is a plan view explaining a configuration of a sheet-like substrate in an electronic circuit connection structure of a third exemplary embodiment of the present invention.
Figure 11B:
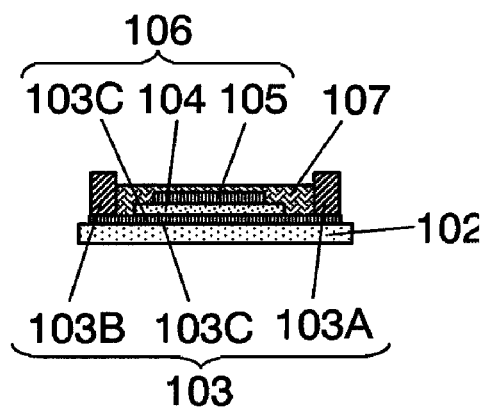
FIG. 11B is a cross sectional view taken along line 11B-11B of FIG. 11A.
Figure 12A:
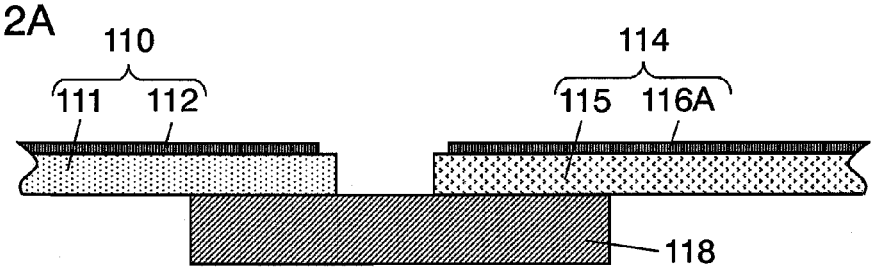
FIG. 12A is a cross sectional view taken along line 12A-12A of FIG. 12B of when a first wiring substrate and a second wiring substrate are arranged on a fixing lower base, describing a configuration of connecting two wiring substrates using the sheet-like substrate in the electronic circuit connection structure of the third exemplary embodiment of the present invention.
Figure 12B:
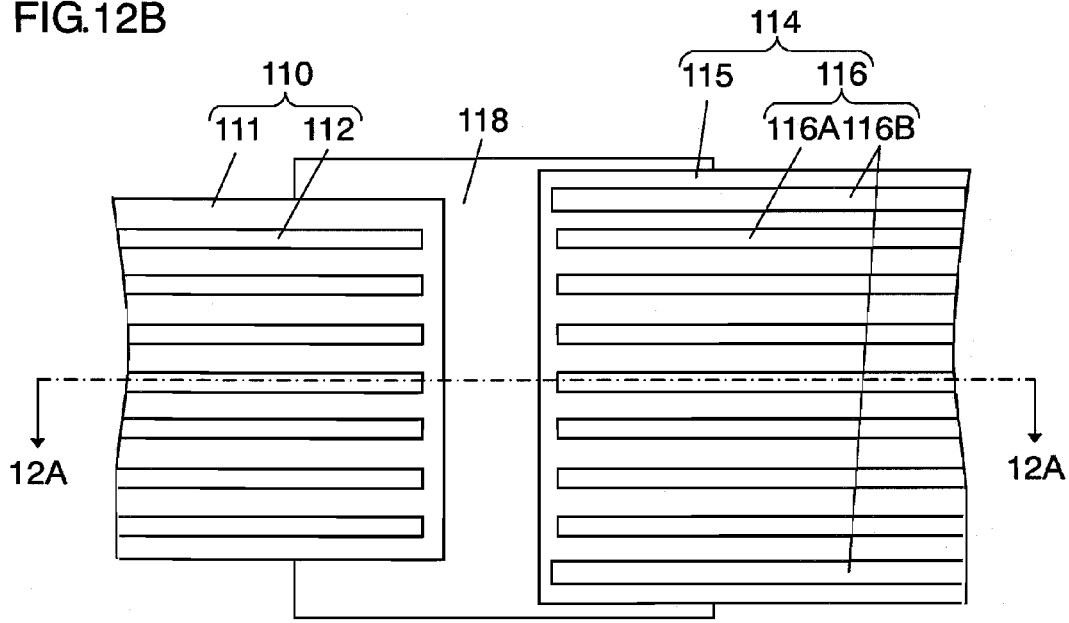
FIG. 12B is a plan view of FIG. 12A.
Figure 12C:
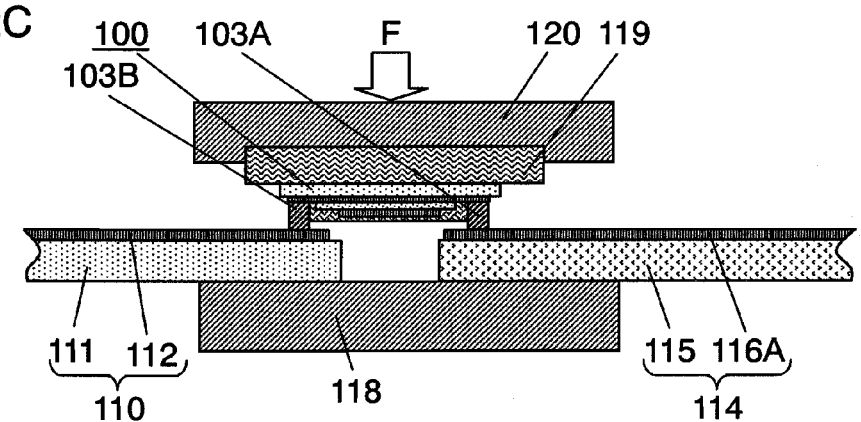
FIG. 12C is a cross sectional view showing a state in which the sheet-like substrate is aligned and fixed by a fixing upper base, and then electrically and mechanically connected, describing the configuration of connecting two wiring substrates using the sheet-like substrate in the electronic circuit connection structure of the third exemplary embodiment of the present invention.
Figure 12D:
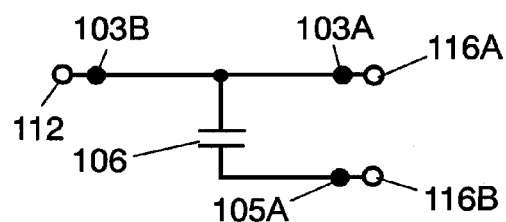
FIG. 12D is an equivalent circuit diagram of the sheet-like substrate in the electronic circuit connection structure of the third exemplary embodiment of the present invention.

FIG. 11A to FIG. 12D are views explaining a configuration of an electronic circuit connection structure according to a third exemplary embodiment of the present invention. FIG. 11A is a plan view of sheet-like substrate 100 used in the electronic circuit connection structure, and FIG. 11B is a cross sectional view taken along line 11B-11B of FIG. 11A. FIG. 12A is a cross sectional view of when first wiring substrate 110 and second wiring substrate 114 are arranged on fixing lower base 118, FIG. 12B is a plan view thereof, FIG. 12C is a cross sectional view showing a state in which sheet-like substrate 100 is aligned and fixed by fixing upper base 120, and then electrically and mechanically connected to form the electronic circuit connection structure, and FIG. 12D is an equivalent circuit diagram thereof. FIG. 12A is a cross sectional view taken along line 12A-12A of FIG. 12B.

As shown in FIG. 12C, the electronic circuit connection structure of the present exemplary embodiment includes first wiring substrate 110 having a first connection terminal region formed at a constant pitch on a first base material, second wiring substrate 114 having a second connection terminal region formed at the same pitch as the first connection terminal region, and sheet-like substrate 100 for electrically connecting the first connection terminal region of first wiring substrate 110 and the second connection terminal region of second wiring substrate 114. Sheet-like substrate 100 has a configuration of being arranged and pressure welded so as to be laminated on first wiring substrate 110 and second wiring substrate 114. Since sheet-type substrate 100 is manufactured very thin, increase in thickness of the electronic circuit connection structure as a whole is negligible. Consequently, the chip capacitor for noise removal does not need to be mounted on the surface of first wiring substrate 110 or second wiring substrate 114, and thus first wiring substrate 110 or second wiring substrate 114 can be further miniaturized.

The configuration of the electronic circuit connection structure of the present exemplary embodiment will now be described in further detail. First, sheet-like substrate 100 will be described. Sheet-like substrate 100 includes sheet-like base material 102, at least the surface of which is insulative; plurality of wiring conductors 130, formed on sheet-like base material 102, for connecting two connection terminals of first wiring substrate 110 and second wiring substrate 114; and capacitor element 106 formed on sheet-like base material 102 and configured from lower layer electrode layer 103C, dielectric layer 104, and upper layer electrode layer 105.

All wiring conductors 103 also function as lower layer electrode layer 103C of capacitor element 106 in the case of the present exemplary embodiment. Upper layer electrode layer 105 of capacitor element 106 is connected each other, and the extended portion thereof is connected to ground conductor 105A of the wiring conductor.

In the case of sheet-like substrate 100, capacitor element 106 is arranged at plurals at the central part of sheet-like base material 102. Wiring conductor 103 is formed so as to transverse the row of capacitor elements 106, and connection regions 103A and 103B for connecting the two wiring substrates (not shown) are arranged on both sides with capacitor element 106 as the center. One part of wiring conductor 103 configures lower layer electrode layer 103C of each capacitor element 106.

A method of manufacturing sheet-like substrate 100 will now be briefly described. A relatively thin resin sheet having flexibility is desirably used for sheet-like base material 102. In terms of ensuring pressure withstanding property of dielectric layer 104 for forming the capacitor element and pattern processing, the surface is desirably made as smooth as possible. In view of such, one of the preferred materials is polyimide resin.

Metal material having satisfactory conductivity and having a relatively satisfactory adhesiveness to resin such as aluminum (Al) is formed on the surface of sheet-like base material 102 through a film forming method such as sputtering. The exposure process and the etching process are then performed to form plurality of wiring conductors 103 in stripe form, as shown in FIG. 11A and FIG. 11B.

After film forming the material generally used for the dielectric material such as barium titanate ($BaTiO_3$), tantalum oxide ($Ta_2O_5$), silicon nitride ($Si_3N_4$), or silicon dioxide ($SiO_2$) through sputtering, the exposure process and the etching process are performed to form dielectric layer 104. In this case, dielectric layer 104 is formed to reliably cover a region which becomes lower layer electrode layer 103C of wiring conductor 103. Thereafter, copper (Cu) is formed through film forming method such as sputtering, and the exposure process and the etching process are performed to form upper layer electrode layer 105.

A plated film having a two-layer configuration of copper (Cu) and gold (Au) is formed in connection regions 103A and 103B of wiring conductor 103 including connection region 105B of ground conductor 105A. Protective film 107 is desirably formed in a region excluding connection regions 103A and 103B and connection region 105B of ground conductor 105A. Such protective film 107 may be formed by printing etc. resin material such as plated resist. The thickness of the plated film is preferably thicker than the thickness of protective film 107.

Sheet-like substrate 100 is thereby obtained. Sheet-like substrate 100 may be collectively formed in plurals using a resin sheet having a large area.

The electronic circuit connection structure will now be described with reference to FIG. 12A to FIG. 12D. As shown in FIG. 12A and FIG. 12B, first wiring substrate 110 has first connection terminal region 112 formed at the same pitch as wiring conductor 103 of sheet-like substrate 100 on first base material 111. Although not illustrated, various wiring patterns are formed on the extended portion of first connection terminal region 112, and the electronic components are mounted thereon.

Second wiring substrate 114 has inter-substrate connection terminal region 116A formed at the same pitch as wiring conductor 103 of sheet-like substrate 100 and first connection terminal region 112 of first wiring substrate 110 on second base material 115. Furthermore, ground connection terminal region 116B connecting with ground conductor 105A of sheet-like substrate 100 is also formed on second wiring substrate 114. The extended portion of ground connection terminal region 116B is connected to a ground terminal (not shown). Ground connection terminal region 116B and inter-substrate connection terminal region 116A are collectively referred to as second connection terminal region 116. Although not illustrated, first wiring substrate 110 has various wiring patterns formed on the extended portion of second connection terminal region 116, and the electronic components are mounted thereon.

As shown in FIG. 12A and FIG. 12B, first connection terminal region 112 and second connection terminal region 116 are aligned so as to correspond to each other on fixing lower base 118, and fixed by double-sided tape and the like. Thereafter, connection region 105B of ground conductor 105A, which is one of wiring conductor 103 of sheet-like substrate 100, and connection regions 103A and 103B are adhered to first connection terminal region 112 and second connection terminal region 116. Fixing upper base 120 is then pressed against thereto with elastic member 119 made of rubber etc. sandwiched in between and fixed in a state pressed by spring or screw (not shown).

The configuration of the equivalent circuit diagram shown in FIG. 12D is thereby realized. A configuration in which first connection terminal region 112 of first wiring substrate 110 and second connection terminal region 116 of second wiring substrate 114 are electrically connected, and capacitor element 106 is connected thereto is thereby obtained. Noise removal thus can be carried out. Since capacitor element 106 is formed through thin film process, sheet-like substrate 100 can be formed very thin. Thus, as shown in FIG. 12C, even if a connection structure is manufactured by being arranged so as to be laminated on first wiring substrate 110 and second wiring substrate 114, increase in thickness as a whole is negligible. Consequently, the chip capacitor for noise removal does not need to be mounted on the surface of first wiring substrate 110 or second wiring substrate 114, and thus first wiring substrate 110 or second wiring substrate 114 can be further miniaturized.

In the present exemplary embodiment, since sheet-like substrate 100 is connected through pressure bonding, it can be easily changed when first wiring substrate 110 or second wiring substrate 114 becomes defective.

Elastic member 119 is not necessarily required, and does not need to be arranged when pressing fixing upper base 120 with spring.

Moreover, in the present exemplary embodiment, a configuration of pressing with spring, screw or the like using fixing lower base 118 and fixing upper base 120 is adopted, but the present invention is not limited thereto. For example, a configuration of fixing while pressing with clip may be adopted. In place of connection by pressure welding, connection by soldering or conductive adhesive resin may be adopted.

Even if the thicknesses of first wiring substrate 110 and second wiring substrate 114 differ, difference in thickness of a certain extent can be absorbed since sheet-like substrate 100 has flexibility. However, if difference in thickness of an extent that cannot be absorbed is formed, a step is formed in fixing lower base 118 so that surfaces of first wiring substrate 110 and second wiring substrate 114 become the same.

Figure 13A:
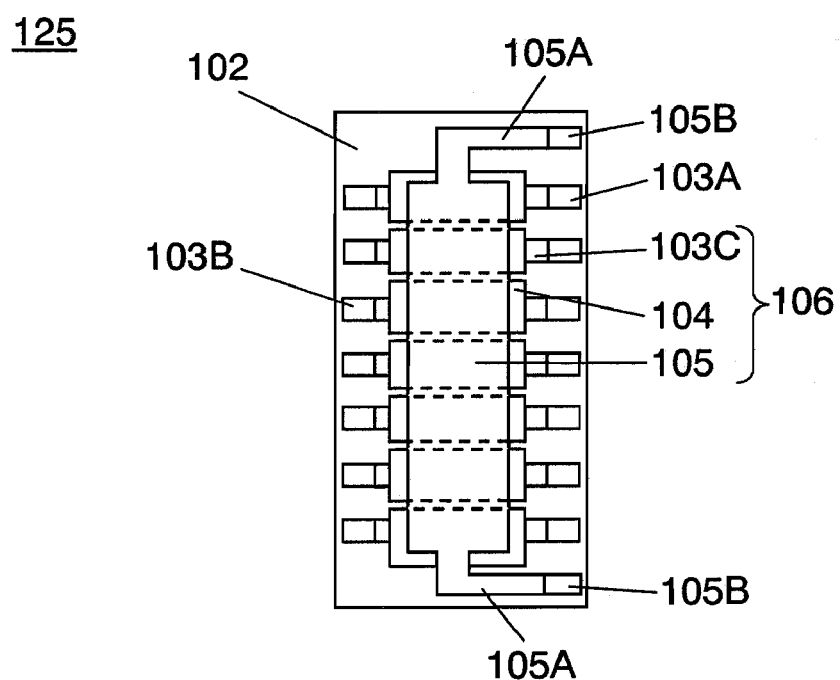
FIG. 13A is a plan view of a first variant example of the sheet-like substrate of the electronic circuit connection structure of the third exemplary embodiment of the present invention.
Figure 13B:
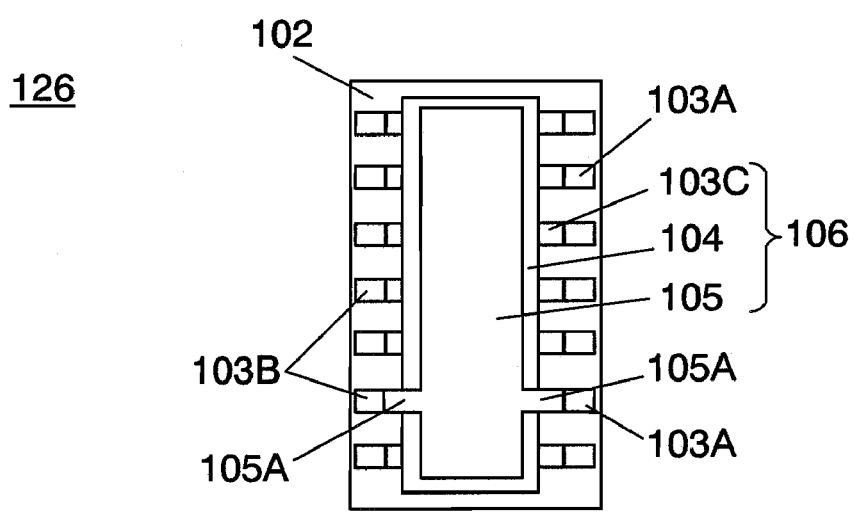
FIG. 13B is a plan view of a second variant example of the sheet-like substrate of the electronic circuit connection structure of the third exemplary embodiment of the present invention.

FIG. 13A is a plan view of sheet-like substrate 125 according to a first variant example used in the electronic circuit connection structure of the present exemplary embodiment, and FIG. 13B is a plan view of sheet-like substrate 126 according to a second variant example.

As shown in FIG. 13A, dielectric layer 104 may be divided for every wiring conductor 103. Thus, stress applied on dielectric layer 104 when sheet-like substrate 125 is pressed and deformed becomes smaller, whereby reliability with respect to deformation further can improve.

As shown in FIG. 13B, sheet-like substrate 126 of the second variant example has a configuration in which ground conductor 105A of upper layer electrode layer 105 is connected to one of wiring conductors 103. Ground conductor 105A is connected to a ground line of first connection terminal region 112 of first wiring substrate 110 and second connection terminal region 116 of second wiring substrate 114. According to such configuration, the wiring substrate that is normally used may be used as it is since ground connection terminal region 116B and the ground line or the extended portion does not need to be separately arranged at second wiring substrate 114.

In the present exemplary embodiment, the upper layer electrode layer has a continuous form including a plurality of capacitor elements, but may be pattern formed for every capacitor element. In this case, a wiring pattern for connecting the upper layer electrode layers divided to each pattern is formed and connected to the ground conductor.

Figure 14A:
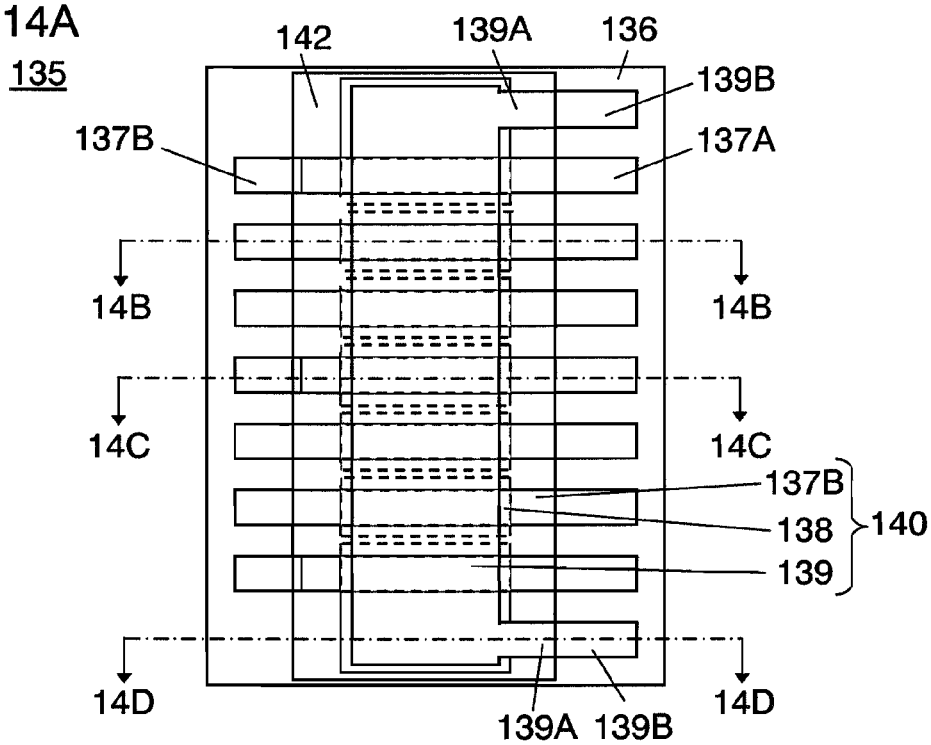
FIG. 14A is a plan view of a third variant example of the sheet-like substrate of the electronic circuit connection structure of the third exemplary embodiment of the present invention.
Figure 14B:
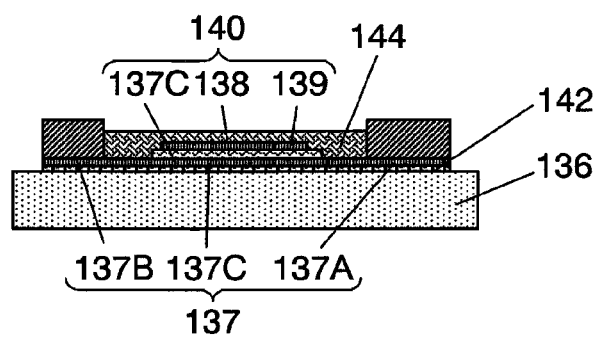
FIG. 14B is a cross sectional view taken along line 14B-14B of FIG. 14A.
Figure 14C:
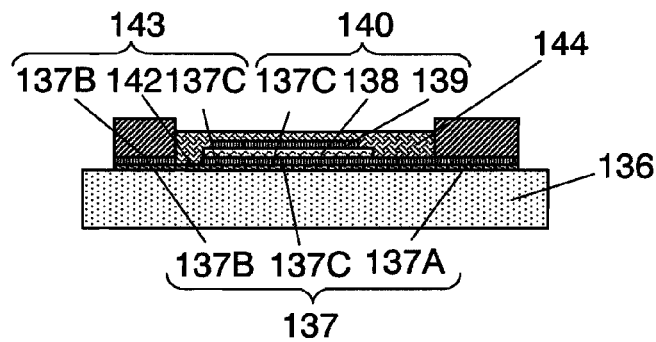
FIG. 14C is a cross sectional view taken along line 14C-14C of FIG. 14A.
Figure 14D:
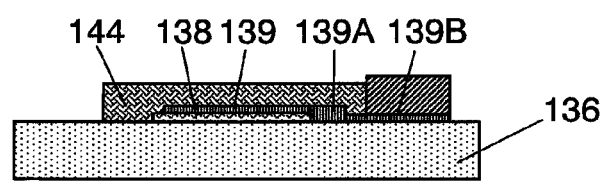
FIG. 14D is a cross sectional view taken along line 14D-14D of FIG. 14A.

Furthermore, sheet-like substrates of various variant examples may be used in the electronic circuit connection structure of the present exemplary embodiment. For instance, the electronic circuit connection structure may be manufactured using sheet-like substrate 135 shown in FIG. 14A. FIG. 14A is a plan view of sheet-like substrate 135 according to a third variant example, FIG. 14B is a cross sectional view taken along line 14B-14B of FIG. 14A, FIG. 14C is a cross sectional view taken along line 14C-14C of FIG. 14A, and FIG. 14D is a cross sectional view taken along line 14D-14D of FIG. 14A.

Sheet-like substrate 135 of the third variant example has a configuration similar to sheet-like substrate 125 of the first variant example of the present exemplary embodiment, but has features in that resistor 143 is arranged at one portion of first, fourth, and seventh wiring conductors 137 of FIG. 14A.

A configuration of sheet-like substrate 135 of the third variant example will be described in further detail below. Sheet-like substrate 135 further has resistor 143 connected in series between connection regions 137A and 137B of wiring conductor 137. One end of lower layer electrode layer 137C of capacitor element 140 also serves as one terminal of resistor 143. Furthermore, upper layer electrode layer 139 of capacitor element 140 is connected to ground conductor 139A.

Capacitor element 140 including lower layer electrode layer 137C, dielectric layer 138, and upper layer electrode layer 139 is formed by the same number as wiring conductor 137 on sheet-like base material 136. In the present exemplary embodiment, one portion of wiring conductor 137 also serves as lower layer electrode layer 137C of capacitor element 140. Moreover, connection regions 137A and 137B are arranged on both sides of lower layer electrode layer 137C. The plated film described in the third exemplary embodiment is formed in connection regions 137A and 137B.

Upper layer electrode layer 139 of capacitor element 140 commonly connects all capacitor elements 140, and is connected to ground conductor 139A. Connection region 139B is arranged at the end of ground conductor 139A, and a plated film is similarly formed on connection region 139B. Protective film 144 is desirably formed in a region excluding connection regions 137A and 137B and connection region 139B of ground conductor 139A. Resin material such as plated resist may be formed through printing etc. as protective film 144. The thickness of the plated film is preferably formed thicker than the thickness of protective film 144.

As shown in FIG. 14A, resistor 143 is arranged in series between connection regions 137A and 137B in first, fourth and seventh wiring conductors 137 set in advance. Resistor 143 is configured by connection region 137B, resistor layer 142, and lower layer electrode layer 137C. Resistor 143 is arranged in series between connection regions 137A and 137B and one terminal of resistor 143 serves as lower layer electrode layer 137C, and thus capacitor element 140 connects with the other terminal of resistor 143 and upper layer electrode layer 139 is grounded by way of ground conductor 139A. The CR filter is thereby configured.

Only capacitor element 140 is connected to wiring conductor 137 not arranged with resistor 143.

The configuration of the laminated electronic circuit connection structure for connecting the wiring substrates using sheet-like substrate 135 of such configuration is similar to the present exemplary embodiment, and thus the description thereof will be omitted.

The CR filter is connected for the necessary wiring conductor, and only the capacitor element is connected to the other wiring conductors by sheet substrate 135 having the above configuration, and thus a more enhanced noise removing effect can be obtained.

The capacitor element is connected to all the wiring conductors in the case of the third variant example, but the present invention is not limited thereto. The capacitor element may be connected to only the wiring conductor set in advance.

The resistor is formed at one portion of the wiring conductor in the third variant example, but the present invention is not limited thereto. Similar CR filter configuration can be obtained by inserting the resistor layer and the resistor electrode layer between the lower layer electrode layer and the dielectric layer. However, in this case, the resistance value is mainly determined in the thickness direction of the resistor layer, and thus material having a large specific resistance must be selected.

Figure 15A:
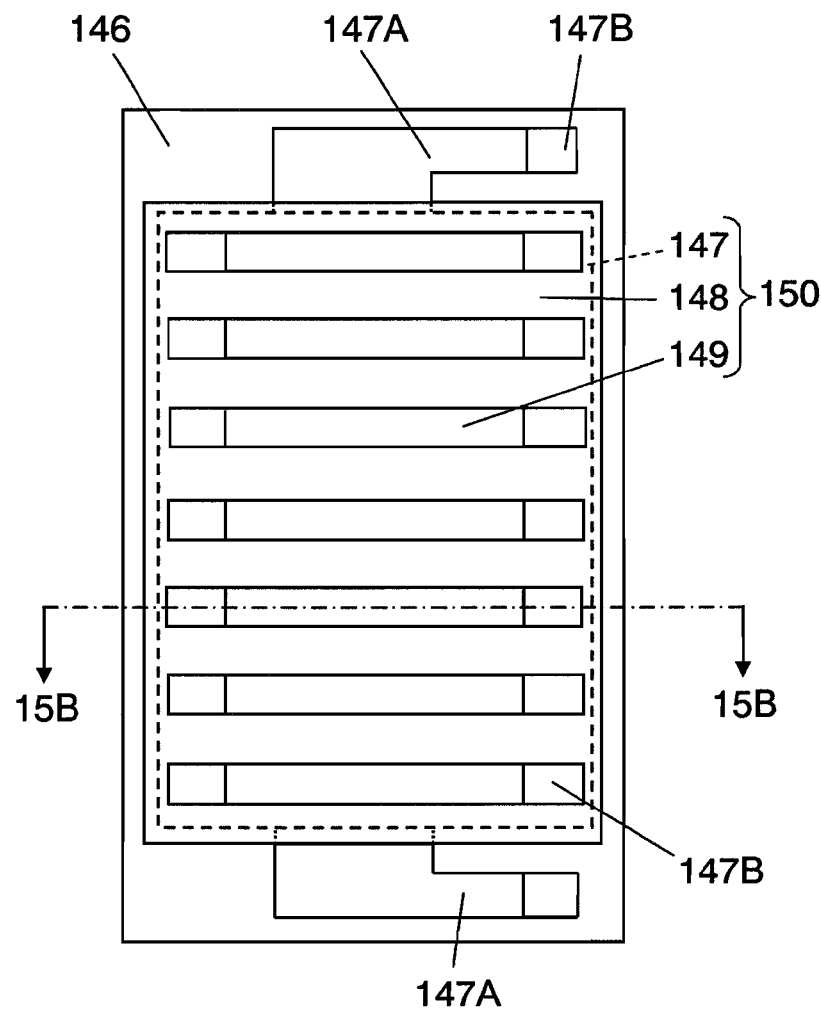
FIG. 15A is a plan view of a fourth variant example of the sheet-like substrate in the third exemplary embodiment of the present invention.
Figure 15B:
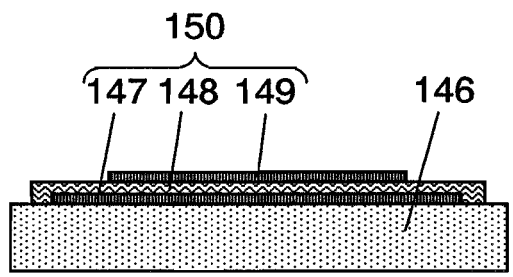
FIG. 15B is a cross sectional view taken along line 15B-15B of FIG. 15A.

FIG. 15A is a plan view of sheet-like substrate 14 according to a fourth variant example used in the electronic circuit connection structure of the present exemplary embodiment, and FIG. 15B is a cross sectional view taken along line 15B-15B of FIG. 15A. Sheet-like substrate 145 of the fourth variant example has a configuration in which capacitor element 150 is arranged at plurals at the central part of sheet-like base material 146, at least a plurality of lower layer electrode layers 147 of capacitor element 150 is connected each other and connected to ground conductor 147A, and upper layer electrode layer 149 of capacitor element 150 functions also as a wiring conductor. That is, lower layer electrode layer 147 of sheet-like base material 146 is formed to an area smaller than the area of dielectric layer 148. Dielectric layer 148 is formed so as to cover lower layer electrode layer 147. Upper layer electrode layer 149 also serving as a wiring conductor is formed on the upper surface of dielectric layer 148.

In this case, plated film or the like is formed in connection region 147B of ground conductor 147A so as to be the same height as upper layer electrode layer 149 serving also as at least the wiring conductor. The plated film may also be formed on upper layer electrode layer 149 also serving as a wiring conductor. In this case, a protective film is formed in a region excluding the connection region on both sides of upper layer electrode layer 149 also serving as a wiring conductor and the connection region of ground conductor 147A, and a plated film may be formed so as to be higher than the protective film. The reliability can be more enhanced according to such configuration.

The configuration of the laminated electronic circuit connection structure for connecting two wiring substrates using sheet-like substrate 145 of the fourth variant example is basically the same as the configuration described in the present exemplary embodiment, and thus the description thereof will be omitted.

Sheet-like substrate 145 of the fourth variant example can realize the electronic circuit connection structure for connecting two wiring substrates with a simpler configuration, and thus can be inexpensively manufactured.

A resistor may be formed between the connection regions of the upper layer electrode layer also serving as the wiring conductor. The CR filter is configured by forming the resistor. To this end, when forming upper layer electrode layer 149, a resistor layer is formed in advance, and upper layer electrode layer 149 is etching removed at only the region of forming the resistor so that the resistor can be easily formed at the necessary position.

Figure 16A:
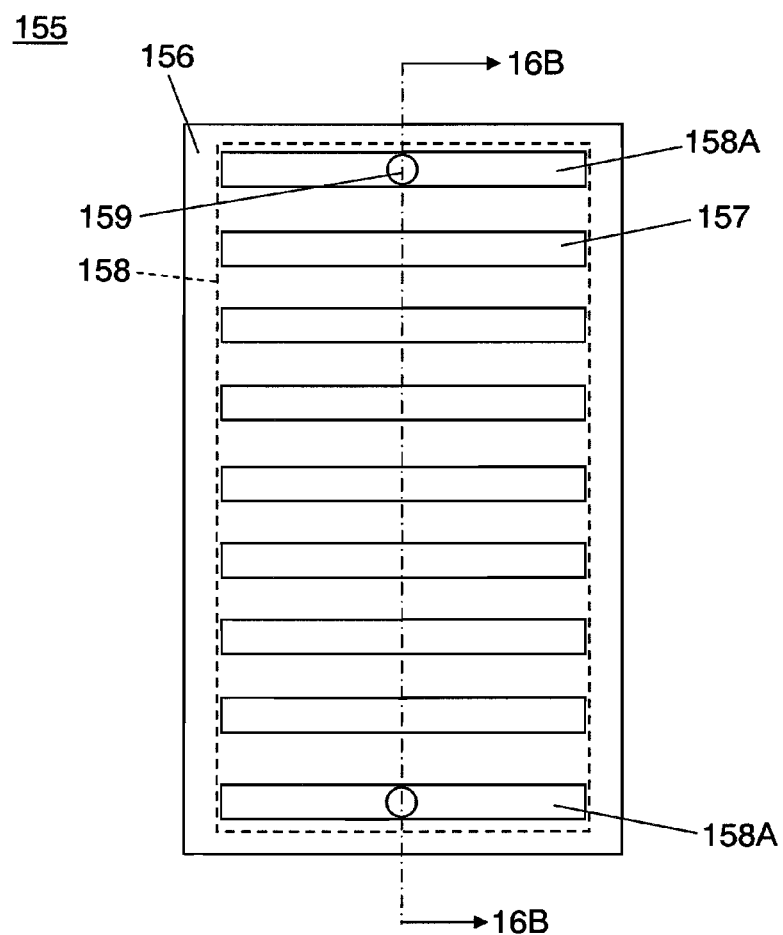
FIG. 16A is a plan view of a fifth variant example of the sheet-like substrate in the electronic circuit connection structure of the third exemplary embodiment of the present invention.
Figure 16B:
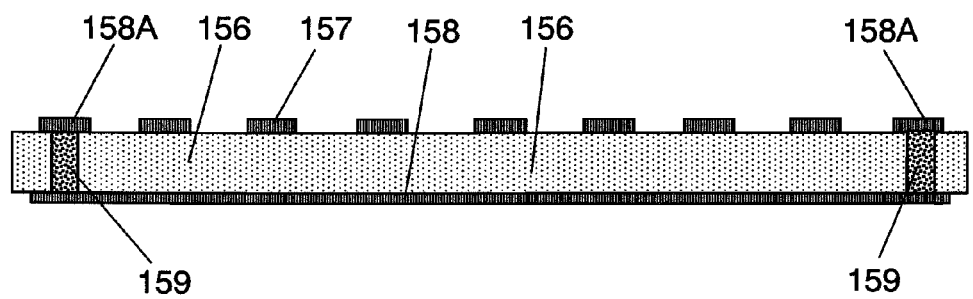
FIG. 16B is a cross sectional view taken along line 16B-16B of FIG. 16A.

FIG. 16A is a plan view of sheet-like substrate 155 according to a fifth variant example used in the electronic circuit connection structure of the present exemplary embodiment, and FIG. 16B is a cross sectional view taken along line 16B-16B of FIG. 16A. Sheet-like substrate 155 of the fifth variant example has features in that sheet-like base material 156 is configured by dielectric resin mixed with resin material such as polyimide or polyester and high permittivity material such as barium titanate.

Upper layer electrode layer 157 also serving as a wiring conductor is formed on one face of sheet-like base material 156, and lower layer electrode layer 158 having an area slightly smaller than the area of sheet-like base material 156 is formed on the other face. Lower layer electrode layer 158 on the other face is connected to ground conductor 158A on upper layer electrode layer 157 side by way of penetrating conductor 159.

The configuration of the laminated electronic circuit connection structure for connecting two wiring substrates using sheet-like substrate 155 of the fifth variant example is basically the same as the configuration described in the present exemplary embodiment, and thus the description thereof will be omitted.

Sheet-like substrate 155 of the fifth variant example can realize the electronic circuit connection structure for connecting two wiring substrates with a simpler configuration, and thus can be inexpensively manufactured.

A resistor may be formed between the connection regions of the upper layer electrode layer also serving as the wiring conductor. The CR filter is configured by forming the resistor. To this end, when forming upper layer electrode layer 155, a resistor layer is formed in advance, and upper layer electrode layer 157 is etching removed at only the region of forming the resistor so that the resistor can be easily formed at the necessary position.

Fourth Exemplary Embodiment

Figure 17A:
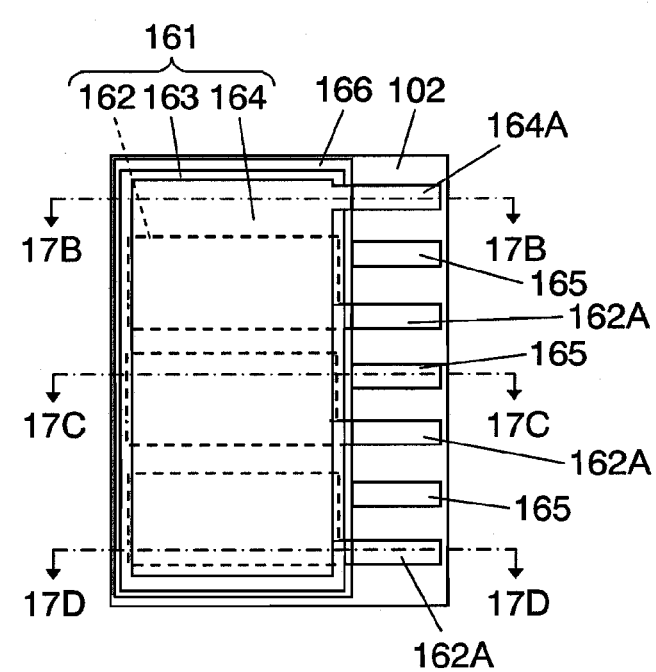
FIG. 17A is a plan view of a sheet-like in an electronic circuit connection structure of a fourth exemplary embodiment of the present invention.
Figure 17B:
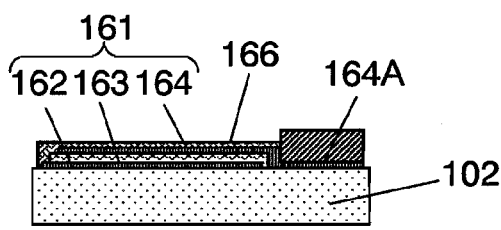
FIG. 17B is a cross sectional view taken along line 17B-17B of FIG. 17A.
Figure 17C:
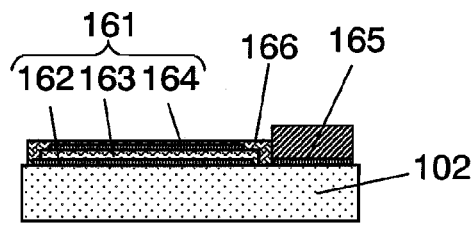
FIG. 17C is a cross sectional view taken along line 17C-17C of FIG. 17A.
Figure 17D:
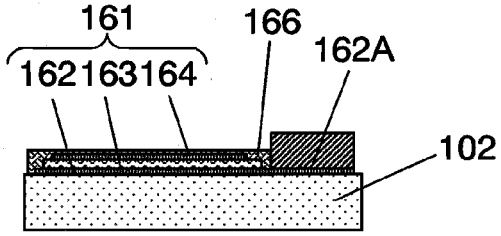
FIG. 17D is a cross sectional view taken along line 17D-17D of FIG. 17A.
Figure 18A:
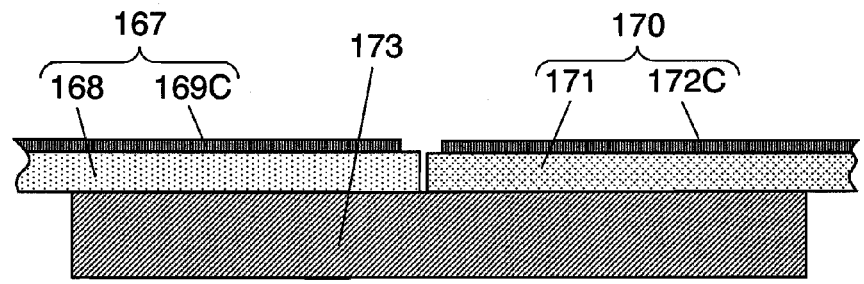
FIG. 18A is a cross sectional view taken along line 18A-18A of FIG. 18B of when a first wiring substrate and a second wiring substrate are arranged on a fixing lower base, describing a configuration of connecting two wiring substrates using the sheet-like in the electronic circuit connection structure of the fourth exemplary embodiment of the present invention.
Figure 18B:
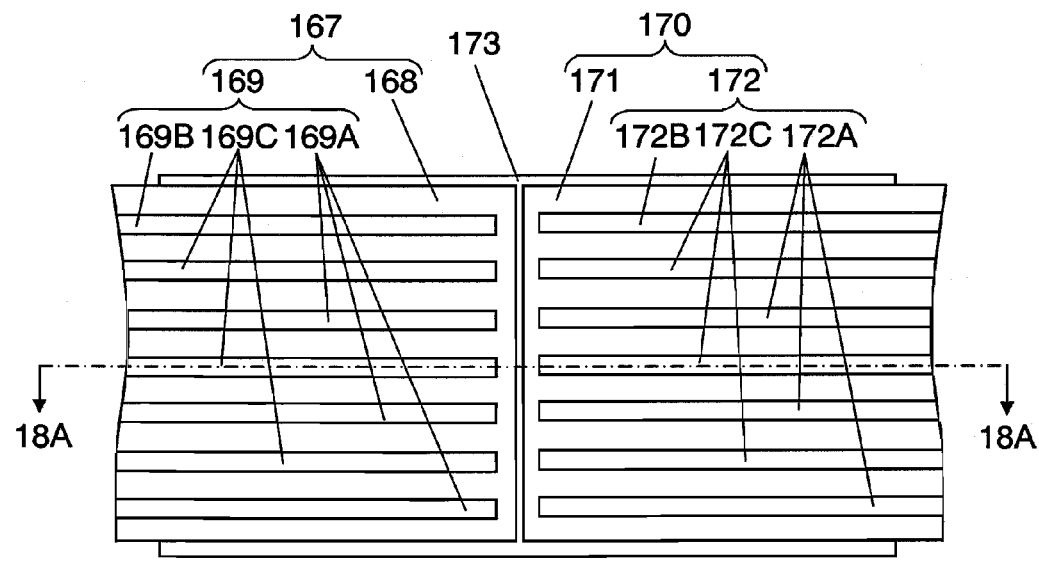
FIG. 18B is a plan view of FIG. 18A.
Figure 18C:
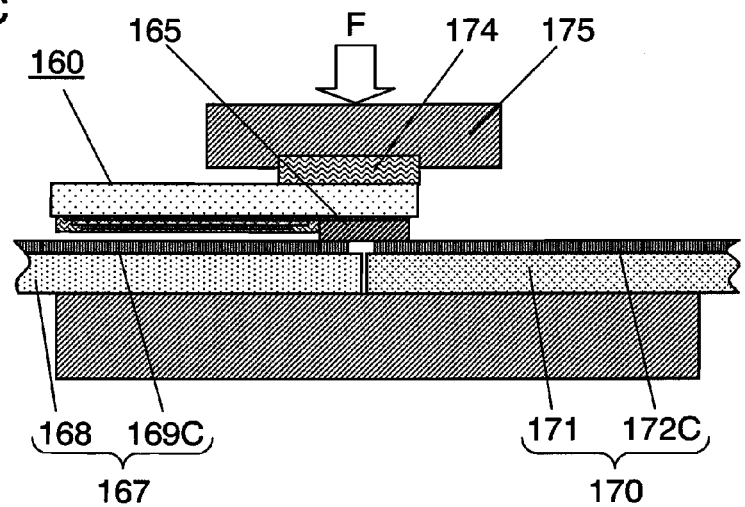
FIG. 18C is a cross sectional view showing a state in which the sheet-like substrate is aligned and fixed by a fixing upper base, and then electrically and mechanically connected, describing the configuration of connecting two wiring substrates using the sheet-like in the electronic circuit connection structure of the fourth exemplary embodiment of the present invention.

FIG. 17A to FIG. 18C are views describing a configuration of the laminated electronic circuit connection structure according to a fourth exemplary embodiment of the present invention. FIG. 17A is a plan view of sheet-like substrate 160 used in the electronic circuit connection structure, FIG. 17B is a cross sectional view taken along line 17B-17B of FIG. 17A, FIG. 17C is a cross sectional view taken along line 17C-17C of FIG. 17, and FIG. 17D is a cross sectional view taken along line 17D-17D of FIG. 17. FIG. 18A is a cross sectional view of when first wiring substrate 167 and second wiring substrate 170 are arranged on fixing lower base 173, FIG. 18B is a plan view thereof, and FIG. 18C is a cross sectional view showing a state in which sheet-like substrate 160 is aligned with respect to first wiring substrate 167 and second wiring substrate 170 and fixed by fixing upper base 175, and then electrically and mechanically connected to form a connection structure. FIG. 18A is a cross sectional view taken along line 18A-18A of FIG. 18B.

The electronic circuit connection structure of the present exemplary embodiment has first wiring substrate 167 and second wiring substrate 170 fixed on fixing lower base 173, and a connection region of sheet-like substrate 160 pressure welded to first connection region 169 of first wiring substrate 167 and second connection terminal region 172 of second wiring substrate 170 to perform electrical connection. In the present exemplary embodiment, a configuration similar to the equivalent circuit diagram shown in FIG. 12D is obtained. Since the chip capacitor for noise removal does not need to be mounted on the surface of first wiring substrate 167 or second wiring substrate 170, the electronic circuit connection structure in which first wiring substrate 167 or second wiring substrate 170 can be further miniaturized is obtained.

The configuration of the electronic circuit connection structure of the present exemplary embodiment will be described in further detail below. First, sheet-like substrate 160 will be described. Sheet-like substrate 160 has wiring conductors 162A, 164A and 165 for connecting two wiring substrates arranged on one side of sheet-like base material 102, and capacitor element 161 has a configuration of being arranged at plurals on the other side of sheet-like base material 102. In the case of the present exemplary embodiment, wiring conductor 162A has extended portion connecting to lower layer electrode layer 162 of capacitor element 161. Wiring conductor 164A (hereinafter referred to as ground conductor 164A), which becomes a ground conductor, has extended portion connecting to upper layer electrode layer 164 of capacitor element 161. Wiring conductor 165 is not connected at all to capacitor element 161. As apparent from FIG. 14, most of wiring conductors 162A and 165 and ground conductor 164A configure connection regions. Similar to the third exemplary embodiment, a copper (Cu)-gold (Au) plated layer is laminated on the connection region.

The material and the manufacturing method of lower layer electrode layer 162, dielectric layer 163, and upper layer electrode layer 164 of capacitor element 161, and furthermore, wiring conductors 162A, and 165 and ground conductor 164A are the same as the material and the manufacturing method in the third exemplary embodiment, and thus the description thereof will be omitted. Protective film 166 to be formed in a region including capacitor element 161 uses the same material and the manufacturing method as the third exemplary embodiment, and thus the description thereof will be omitted.

Sheet-like substrate 160 connects capacitor element 161 only to wiring conductor 162A where noise removal is demanded, and capacitance value of capacitor element can be increased, that is, area of capacitor element can be easily increased.

The electronic circuit connection structure configured using sheet-like substrate 160 will now be described. As shown in FIG. 18A and FIG. 18B, in first wiring substrate 167, first connection terminal region 169 is formed at the same pitch as wiring conductors 162A and 165 of sheet-like substrate 160 and ground conductor 164A which is one of wiring conductor on first base material 168. Although not illustrated, various wiring patterns are formed on the extended portion of first connection terminal region 169, and the electronic components are mounted thereon.

In second wiring substrate 170, second connection terminal region 172 is formed at the same pitch as wiring conductors 162A and 165 of sheet-like substrate 160 and ground conductor 164A on second base material 171.

As apparent from FIG. 18A and FIG. 18B, first connection region 169 of first wiring substrate 167 and second connection terminal region 172 of second wiring substrate 170 are formed at the same pitch and in same numbers. However, they do not necessarily need to be in same numbers. That is, wiring conductors that are not used may be arranged on one wiring substrate or on both wiring substrates.

Furthermore, element connection terminal region 169A of first connection terminal region 169 and element connection terminal region 172A of second connection terminal region 172 connecting with wiring conductor 162A of sheet-like substrate 160 is connected to lower layer electrode layer 162 of capacitor element 161 of sheet-like substrate 160.

However, connection terminal region 169C of first connection terminal region 169 and connection terminal region 172C of second connection terminal region 172 is only performed with electrical connection by wiring conductor 165.

Ground connection terminal 169B of first connection terminal region 169 and ground connection terminal region 172B of second connection terminal region 172 are connected to ground conductor 164A which is one of the wiring conductor of sheet-like substrate 160, and they are ground lines and are connected to the ground terminal (not shown) with either first wiring substrate 167 or second wiring substrate 170, or both.

As shown in FIG. 18C, in the present exemplary embodiment as well, first wiring substrate 167 and second wiring substrate 170 are fixed to fixing lower base 173 by double-sided tape. Thereafter, the connection region of sheet-like substrate 160 is pressure welded to first connection region 169 of first wiring substrate 167 and second connection terminal region 172 of second wiring substrate 170 to perform electrical connection. To this end, fixing upper base 175 and elastic member 174 made of rubber material are pressed thereto. They are then fixed in a pressed state by spring or screw (not shown). The electronic circuit connection structure of the present exemplary embodiment can be thereby realized.

In the present exemplary embodiment as well, a configuration similar to the equivalent circuit diagram shown in FIG. 12D is obtained. That is, first connection terminal region 169 of first wiring substrate 167 and second connection terminal region 172 of second wiring substrate 170 are electrically connected, and the wiring conductors set in advance are connected to the terminals set in advance through pressure welding. Capacitor element 161 is connected to the terminals set in advance, so that noise can be removed. Capacitor element 161 is formed through a thin film process, and thus increase in the thickness as a whole is negligible even if sheet-like substrate 160 is arranged so as to be laminated on first wiring substrate 167 and second wiring substrate 170, as shown in FIG. 18C. Consequently, the chip capacitor for noise removal does not need to be mounted on the surface of first wiring substrate 167 or second wiring substrate 170, and first wiring substrate 167 or second wiring substrate 170 can be further miniaturized.

Since sheet-like substrate 160 is connected through pressure bonding in the electronic circuit connection structure of the present exemplary embodiment, it can be easily changed even if first wiring substrate 167 or second wiring substrate 170 becomes defective.

Elastic member 174 is not necessarily required, and does not need to be arranged when pressing fixing upper base 175 with spring.

In the present exemplary embodiment, a configuration of pressing with spring, screw or the like using fixing lower base 173 and fixing upper base 175 is adopted, but the present invention is not limited thereto. For example, a configuration of fixing while pressing with clip may be adopted. In place of connection by pressure welding, connection by soldering or conductive adhesive resin may be adopted.

Even if the thicknesses of first wiring substrate 167 and second wiring substrate 170 differ, difference in thickness of a certain extent can be absorbed since sheet-like substrate 160 has flexibility. However, if difference in thickness of an extent that cannot be absorbed is formed, a step is formed in fixing lower base 173 so that surfaces of first wiring substrate 167 and second wiring substrate 170 become the same.

In the present exemplary embodiment, a configuration of connecting the capacitor element only to the wiring conductor set in advance is adopted, but the present invention is not limited thereto. The capacitor element may be connected to all the wiring conductors similar to the third exemplary embodiment. Only one ground conductor is provided in the present exemplary embodiment, but two or more may be provided. The upper layer electrode layer and the dielectric layer may be divided in correspondence to the respective capacitor element. In this case, a wiring pattern for connecting the upper layer electrode layers may be formed and connected to the ground conductor.

Fifth Exemplary Embodiment

Figure 19A:
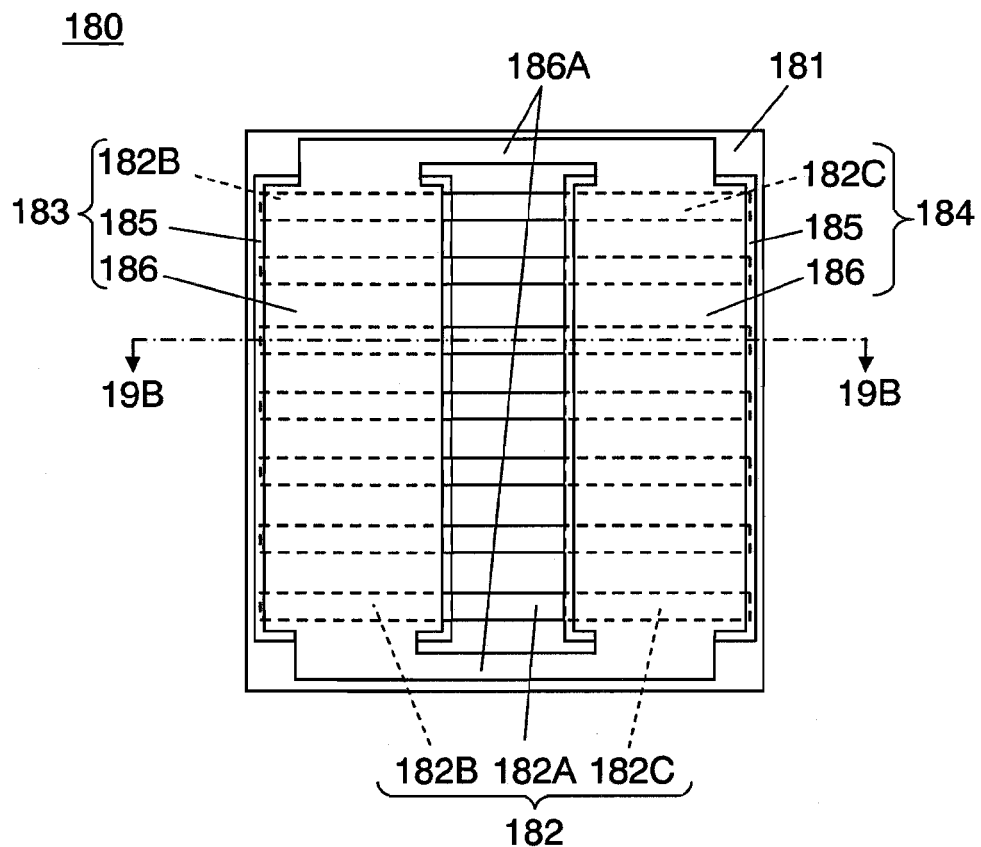
FIG. 19A is a plan view of a sheet-like substrate in an electronic circuit connection structure of a fifth exemplary embodiment of the present invention.
Figure 19B:
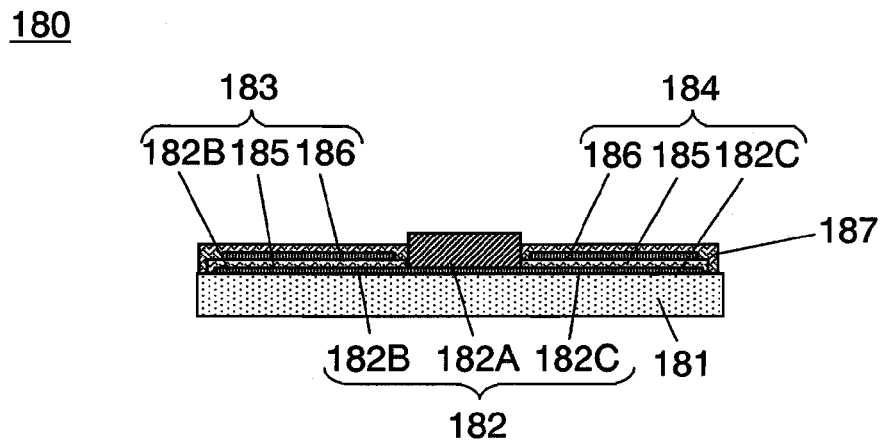
FIG. 19B is a cross sectional view taken along line 19B-19B of FIG. 19A.
Figure 20A:
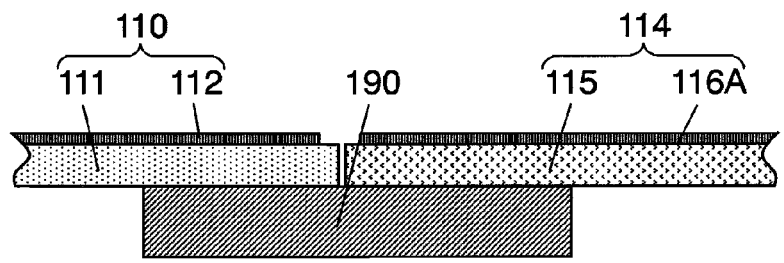
FIG. 20A is a cross sectional view taken along line 20A-20A of FIG. 20B of when a first wiring substrate and a second wiring substrate are arranged on a fixing lower base, describing a configuration of connecting two wiring substrates using the sheet-like substrate in the electronic circuit connection structure of the fifth exemplary embodiment of the present invention.
Figure 20B:
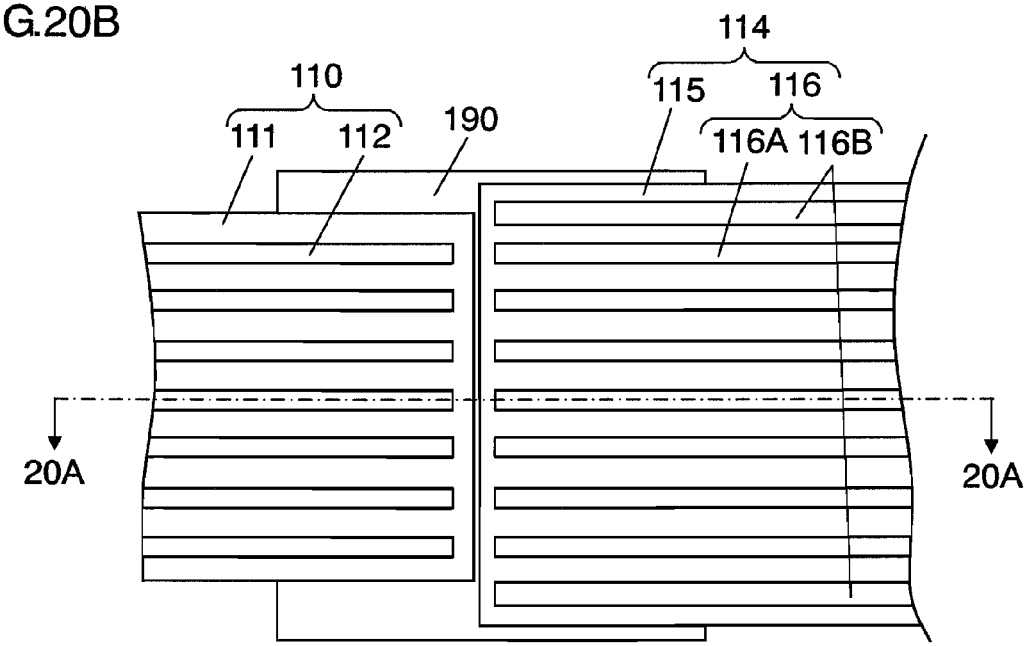
FIG. 20B is a plan view of FIG. 20A.
Figure 20C:
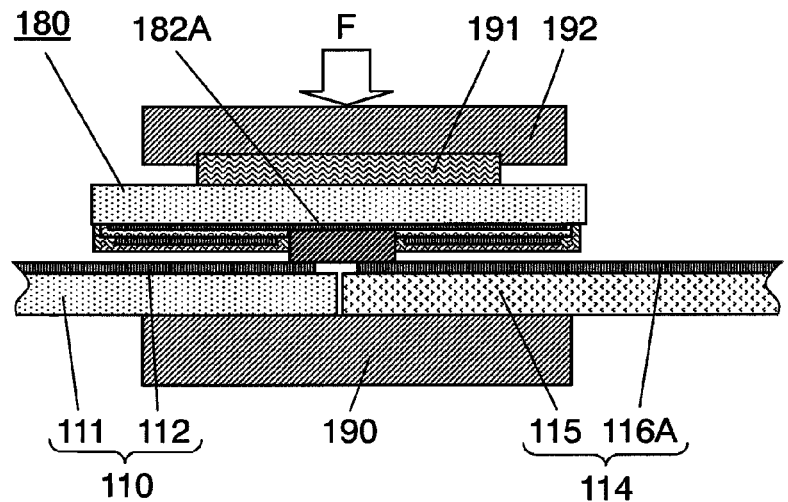
FIG. 20C is a cross sectional view showing a state in which the sheet-like substrate is aligned and fixed by a fixing upper base, and then electrically and mechanically connected, describing a configuration of connecting two wiring substrates using the sheet-like substrate in the electronic circuit connection structure of the fifth exemplary embodiment of the present invention.
Figure 21:
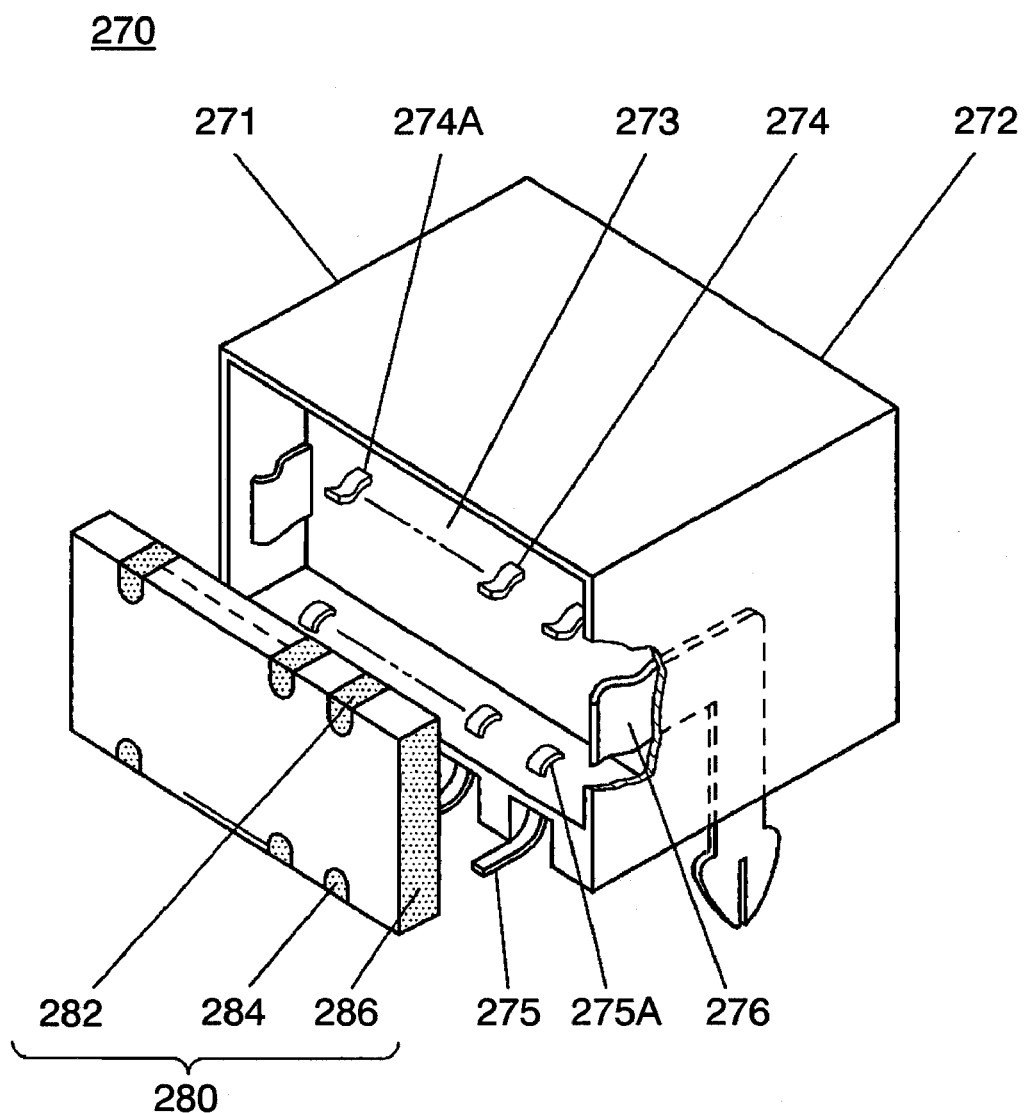
FIG. 21 is a view showing an example in which a conventional noise filter is accommodated and integrated with a connector.

FIG. 19A to FIG. 10C are views describing a configuration of a laminated electronic circuit connection structure according to a fifth exemplary embodiment of the present invention. FIG. 19A is a plan view of sheet-like substrate 180 used in the electronic circuit connection structure of the present exemplary embodiment, and FIG. 19B is a cross sectional view taken along line 19B-19B of FIG. 19A. FIG. 20A is a cross sectional view of when first wiring substrate 110 and second wiring substrate 114 are arranged on fixing lower base 190, FIG. 20B is a plan view thereof, and FIG. 20C is a cross sectional view showing a state in which sheet-like substrate 180 is aligned with respect to first wiring substrate 110 and second wiring substrate 114 and fixed by fixing upper base 192, and then electrically and mechanically connected to form an electronic circuit connection structure. FIG. 20A is a cross sectional view taken along line 20A-20A of FIG. 20B.

The electronic circuit connection structure of the present exemplary embodiment has a configuration in which first connection terminal region 112 of first wiring substrate 110 and second connection terminal region 116 of second wiring substrate 114 are arranged and fixed proximate to each other, and thereafter, sheet-like substrate 180 is arranged so as to be laminated and fixed thereon with elastic member 191 made of rubber sandwiched in between. A configuration basically the same as the configuration of the equivalent circuit diagram shown in FIG. 12D can be realized. As a result, a more compact and thin electronic circuit connection structure is obtained.

The configuration of the electronic circuit connection structure of the present exemplary embodiment will now be described in further detail. First, sheet-like substrate 180 will be described. As shown in FIG. 19A, wiring conductor 182 is formed at a constant pitch on the surface of sheet-like base material 181 on sheet-like substrate 180. One portions 182B and 182C of wiring conductor 182 is the lower layer electrode layer of capacitor element 183 and 184. That is, capacitor element 183 is configured by laminating lower layer electrode layer 182B, dielectric layer 185, and upper layer electrode layer 186. Capacitor element 184 is similarly configured by stacking lower layer electrode layer 182C, dielectric layer 185, and upper layer electrode layer 186. Connection region 182A of wiring conductor 182 is arranged at the central part of sheet-like base material 181, where the first wiring substrate and the second wiring substrate are electrically connected by connection region 182A. Connection region 186A connected with upper layer electrode layer 186 is also one of the wiring conductors and is also the ground conductor. The connection region 186A which is also the ground conductor is arranged at the same pitch as another wiring conductors 182.

Wiring conductor 182, dielectric layer 185, upper layer electrode layer 186, and connection regions 182A and 186A are manufactured with the material and the manufacturing method described in the third exemplary embodiment, and thus the description thereof will be omitted. Similar to the third exemplary embodiment, a plated film of copper(Cu)-gold(Au) laminated configuration is formed on connection regions 182A and 186A. Left and right capacitor elements 183 and 184 can be manufactured by simultaneously performing film forming process, exposure process, and etching process.

As shown in FIG. 19B, protective film 187 is formed in a region excluding connection regions 182A and 186A, but protective film 187 is not illustrated in FIG. 19A for the sake of easy understanding.

A configuration of the electronic circuit connection structure using sheet-like substrate 180 will now be described. First wiring substrate 110 and second wiring substrate 114 shown in FIG. 20A and FIG. 20B are the same as those shown in FIG. 12A and FIG. 12B used when manufacturing the electronic circuit connection structure of the third exemplary embodiment, and thus the description thereof will be omitted.

As shown in FIG. 20A and FIG. 20B, first connection terminal region 112 and second connection terminal region 116 are positioned so as to correspond to each other on fixing lower base 190, and then fixed by double-sided tape and the like. In this case, first connection terminal region 112 of first wiring substrate 110 and second connection terminal region 116 of second wiring substrate 114 must be arranged proximate to each other, different from the third exemplary embodiment. This is because the length of connection regions 182A and 186A of sheet-like substrate 180 is short, and first connection terminal region 112 and second connection terminal region 116 must be pressure welded at the relevant regions, as apparent from FIG. 19A and FIG. 19B.

After fixing in such arrangement, connection region (or ground conductor) 186A which is one of the wiring conductors of sheet-like substrate 180 and connection region 182A of another wiring conductor 182 are adhered to first connection terminal region 112 and second connection terminal region 116. Fixing upper base 192 is then pressed thereto with elastic member 191 made of rubber and the like sandwiched in between, and fixed in a state pressed by spring or screw (not shown). The connection structure of the present exemplary embodiment can be thereby realized.

A configuration basically the same as the configuration of the equivalent circuit diagram shown in FIG. 12D can be thus realized. Therefore, a configuration in which first connection terminal region 112 of first wiring substrate 110 and second connection terminal region 116 of second wiring substrate 114 are electrically connected, and capacitor elements 183 and 184 are connected in parallel thereto is obtained. The capacitance value of the capacitor for removing noise thus can be increased.

Furthermore, since capacitor elements 183 and 184 are formed through a thin film process, sheet-like substrate 180 can be formed very thin. Therefore, as shown in FIG. 20C, the increase in thickness as a whole is negligible even if arranged so as to be laminated with respect to first wiring substrate 110 and second wiring substrate 114. Consequently, the chip capacitor for noise removal does not need to be mounted on the surface of first wiring substrate 110 or second wiring substrate 114, and thus first wiring substrate 110 or second wiring substrate 114 can be further miniaturized.

In the case of the present exemplary embodiment, capacitor elements 183 and 184 are connected in parallel, and thus the capacitance value can be increased.

In the present exemplary embodiment, since sheet-like substrate 180 is connected through pressure bonding, it can be easily changed even if first wiring substrate 110 or second wiring substrate 114 becomes defective.

Elastic member 191 is not necessarily required, and does not need to be arranged when pressing fixing upper base 192 with spring.

In the present exemplary embodiment, a configuration of pressing with spring, screw or the like using fixing lower base 190 and fixing upper base 192 is adopted, but the present invention is not limited thereto. For example, a configuration of fixing while pressing with clip may be adopted. In place of connection by pressure welding, connection by soldering or conductive adhesive resin may be adopted.

Even if the thicknesses of first wiring substrate 110 and second wiring substrate 114 differ, difference in thickness of a certain extent can be absorbed since sheet-like substrate 180 has flexibility. However, if difference in thickness of an extent that cannot be absorbed is formed, a step is formed in fixing lower base 190 so that surfaces of first wiring substrate 110 and second wiring substrate 114 become the same.

In the present exemplary embodiment, a configuration in which all wiring conductors 182 are connected to capacitor elements 183 and 184 is adopted, but the present invention is not limited thereto. For instance, a configuration of connecting only the wiring conductor set in advance to the capacitor element may be adopted. The wiring conductor is connected to the capacitor elements arranged on both sides but may be connected to only the capacitor element on one side. Furthermore, dielectric layer and upper layer electrode layer may be formed in a separated manner for every capacitor element. In this case, the upper layer electrodes are connected each other by the wiring pattern and then connected to connection region 186A or the ground conductor.

INDUSTRIAL APPLICABILITY

The electronic circuit connection structure of the present invention is effective in the field of mobile electronic equipments such as mobile phone as compact and thin configuration can be realized by arranging the first sheet-like substrate and the second sheet-like substrate using the gap between the male connector and the first circuit substrate, and the gap between the female connector and the second circuit substrate, and engaging the connectors to form a filter circuit.

The invention claimed is:

1. A laminated electronic circuit connection structure formed by engaging a male connector having a first terminal connected to a connection terminal of a first circuit substrate and a female connector having a second terminal connected to a connection terminal of a second circuit substrate; wherein
   a first sheet-like substrate formed with a plurality of first passive elements is arranged at a region surrounded by the first terminals arranged on both sides of the male connector and the first circuit substrate, an electrode terminal of the first passive element and the connection terminal of the first circuit substrate being connected, and one of the electrode terminals of the first passive element and the first terminal being electrically connected with a wiring for connecting the connection terminals;
   a second sheet-like substrate formed with a plurality of second passive elements is arranged at a region surrounded by the second terminal arranged on both sides of the female connector and the second circuit substrate, an electrode terminal of the second passive element and the connection terminal of the second circuit substrate being connected, and one of the electrode terminals of the second passive element and the second terminal being electrically connected with a wiring for connecting the connection terminals; and
   a filter circuit is configured by the first passive element of the first sheet-like substrate and the second passive element of the second sheet-like substrate by engaging the male connector and the female connector.

2. The electronic circuit connection structure according to claim 1, wherein the first sheet-like substrate is fixed on a surface facing the first circuit substrate of the male connector, and the second sheet-like substrate is fixed on a surface facing the second circuit substrate of the female connector.

3. The electronic circuit connection structure according to claim 1, wherein a concave part for accommodating the first sheet-like substrate and the second sheet-like substrate is formed on a surface facing the first circuit substrate of the male connector and on a surface facing the second circuit substrate of the female connector.

4. The electronic circuit connection structure according to claim 1, wherein the first passive element is formed of a resistor element or a capacitor element, the second passive element is formed of a capacitor element or a resistor element, and the filter circuit is configured by a CR filter.

5. The electronic circuit connection structure according to claim 1, wherein the first passive element is formed of an inductor element, the second passive element is formed of a capacitor element, and the filter circuit is configured by an LC filter.

6. The electronic circuit connection structure according to claim 1, wherein the first passive element is formed of a resistor element and an inductor element, the second passive element is formed of a capacitor element, and the filter circuit configured by a CR filter and an LC filter.

7. The electronic circuit connection structure according to claim 1, wherein with respect to the first terminal and the second terminal set in advance, the connection terminals to be connected with the electrode terminals of the first passive element are connected with a wiring, and the wiring between the connection terminals for electrically connecting one of the electrode terminals of the second passive element and the second terminal is in an opened state.

8. The electronic circuit connection structure according to claim 1, wherein with respect to the first terminal and the second terminal set in advance, the connection terminals to be connected with the electrode terminals of the first passive element are connected with a wiring.

9. An electronic circuit connection structure comprising:
   a first wiring substrate including a first connection terminal region formed at a constant pitch on a first base material;
   a second wiring substrate including a second connection terminal region formed at a pitch same as the first connection terminal on a second base material; and
   a sheet-like substrate for electrically connecting the first connection terminal region of the first wiring substrate and the second connection terminal region of the second wiring substrate; wherein
   the sheet-like substrate includes,
      a sheet-like base material which surface is at least insulative,
      a plurality of wiring conductors, formed on the sheet-like base material, for connecting connection terminals of the two wiring substrates, and
      a capacitor element formed on the sheet-like base material and configured by a lower layer electrode layer, a dielectric layer, and an upper layer electrode layer; and
   a wiring conductor set in advance of the wiring conductors is electrically connected to the lower layer electrode layer or the upper layer electrode layer of the capacitor element, and the upper layer electrode layer or the lower layer electrode layer of the capacitor element is connected to a ground conductor of the wiring conductors.

10. The electronic circuit connection structure according to claim 9, wherein one portion of the wiring conductor set in advance is the lower layer electrode layer or the upper layer electrode layer of the capacitor element.

11. The electronic circuit connection structure according to claim 10, wherein
   the capacitor element is arranged at plurals at a central part of the sheet-like base material; and
   the wiring conductor is formed so as to transverse the capacitor element, a connection region for connecting with the two wiring substrates being arranged on both sides with the capacitor element as a center, and one portion of the wiring conductor configuring the lower layer electrode layer of the respective capacitor element.

12. The electronic circuit connection structure according to claim 9, wherein
   the capacitor element is arranged at plurals at a central part of the sheet-like base material;
   at least a plurality of the lower layer electrode layers of the capacitor elements is connected each other and connected to the ground conductor; and
   the upper layer electrode layers of the capacitor elements also serve as the wiring conductor.

13. The electronic circuit connection structure according to claim 9, wherein
   a connection region of the wiring conductor for connecting with the two wiring substrates is arranged on one side of the sheet-like base material; and
   the capacitor element is arranged at plurals on the other side of the sheet-like base material.

14. The electronic circuit connection structure according to claim 13, wherein the connection region of the wiring conductor is arranged at a central region of the sheet-like base material; and the capacitor element is arranged on both sides with the connection region in between.

15. The electronic circuit connection structure according to claim 13, wherein a resistor connected in series with respect to respective connection terminal for connecting the two wiring substrates is further arranged between the connection regions of the wiring conductors; and one terminal of the resistor and the lower layer electrode layer or the upper layer electrode layer of the capacitor element are connected, and the upper layer electrode layer or the lower layer electrode layer is connected to the ground conductor.

16. An electronic circuit connection structure comprising:

a first wiring substrate including a first connection terminal region formed at a constant pitch on a first base material;

a second wiring substrate including a second connection terminal region formed at a pitch same as the first connection terminal on a second base material; and a sheet-like substrate for electrically connecting the first connection terminal region of the first wiring substrate and the second connection terminal region of the second wiring substrate; wherein the sheet-like substrate includes, a sheet-like base material made of material formed by mixing inorganic dielectric material to an insulating resin, a plurality of wiring conductors, formed on one surface of the sheet-like base material, for connecting the first connection terminal region of the first wiring substrate and the second connection terminal region of the second wiring substrate, and a ground wiring conductor formed at a position facing the wiring conductor on the other face of the sheet-like base material; and the wiring conductor, the sheet-like base material and the ground wiring conductor configure a capacitor element, the ground wiring conductor being connected to a ground conductor formed on a surface formed with the wiring conductor by a penetrating conductor arranged at the sheet-like base material.

17. The electronic circuit connection structure according to claim 9 or 16, wherein an electrical connection of the first connection terminal region of the first wiring substrate and the second connection terminal region of the second wiring substrate is carried out by a connection region formed on the same surface of the sheet-like substrate.

18. The electronic circuit connection structure according to claim 17, wherein an electrical connection of the first connection terminal region of the first wiring substrate and the second connection terminal region of the second wiring substrate is carried out by elastically pressing the connection region of the sheet-like substrate.

19. The electronic circuit connection structure according to claim 17, wherein an electrical connection of the first connection terminal region of the first wiring substrate and the second connection terminal region of the second wiring substrate is carried out by one of connecting the connection region of the sheet-like substrate and the first connection terminal region and the connection region and the second connection terminal region by connecting through soldering or conductive adhesive resin, connecting through anisotropic conductive resin, or connecting through connection by direct contact and connection through mechanical adhesion with insulating resin.

20. The electronic circuit connection structure according to claim 9, wherein the capacitor element of the sheet-like substrate is connected to only the set first connection terminal region and the second connection terminal region of the first connection terminal region of the first wiring substrate and the second connection terminal region of the second wiring substrate.

21. The electronic circuit connection structure according to claim 20, wherein a resistor is further arranged at the connection region for connecting the first connection terminal region and the second connection terminal region in the sheet-type substrate, and a filter circuit is configured including the capacitor element.

22. A method for manufacturing an electronic circuit connection structure; comprising:

forming a first sheet-like substrate having a shape at least smaller than a region surrounded by first terminals arranged on both sides of a male connector and being arranged with a first passive element at a position corresponding to the first terminal;

forming a first circuit substrate including a connection terminal at a position corresponding to the first terminal of the male connector and an electrode terminal of the first passive element of the first sheet-like substrate;

forming a second sheet-like substrate having a shape at least smaller than a region surrounded by second terminals arranged on both sides of a female connector and being arranged with a second passive element at a position corresponding to the second terminal;

forming a second circuit substrate including a connection terminal at position corresponding to the second terminal of the female connector and an electrode terminal of the second passive element of the second sheet-like substrate;

aligning and connecting the connection terminal of the first circuit substrate, and the electrode terminal of the first passive element and the first terminal of the male connector;

aligning and connecting the connection terminal of the second circuit substrate, and the electrode terminal of the second passive element and the second terminal of the female connector; and configuring a filter circuit with the first passive element and the second passive element by engaging the male connector and the female connector.

23. The method for manufacturing the electronic connection structure according to claim 22, further comprising:

fixing the first sheet-like substrate in correspondence to the first terminal and the electrode terminal of the first passive element in a region surrounded by the first terminals of the male connector before connecting the connection terminal of the first circuit substrate and the electrode terminal of the first passive element and the first terminal; and fixing the second sheet-like substrate in correspondence to the second terminal and the electrode terminal of the second passive element in a region surrounded by the second terminal of the female connector before connecting the connection terminal of the second circuit substrate and the electrode terminal of the second passive element and the second terminal.

24. The method for manufacturing the electronic connection structure according to claim 22, wherein in forming the first circuit substrate and the second circuit substrate, with respect to the first terminal and the second terminal set in advance, the connection terminals to be connected with the electrode terminals of the first passive element are connected with a wiring, and the wiring between the connection terminals for electrically connecting one of the electrode terminals of the second passive element and the second terminal is in an opened state.

25. The method for manufacturing the electronic connection structure according to claim 22, wherein in forming the first circuit substrate and the second circuit substrate, with respect to the first terminal and the second terminal set in advance, the connection terminals to be connected with the electrode terminals of the first passive element are connected with a wiring.

* * * * *